United States Patent
Kim et al.

(10) Patent No.: US 6,320,312 B1
(45) Date of Patent: Nov. 20, 2001

(54) ORGANIC ELECTROLUMINESCENT DISPLAY PANEL WITH FIRST AND SECOND BUS ELECTRODES AND ELECTRICALLY INSULATING LAYERS

(75) Inventors: Sung Tae Kim; Jong Geun Yoon; Chang Nam Kim, all of Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 09/642,593

(22) Filed: Aug. 22, 2000

Related U.S. Application Data

(63) Continuation of application No. 09/126,597, filed on Jul. 31, 1998, now Pat. No. 6,140,765.

(30) Foreign Application Priority Data

Jul. 20, 1998  (KR) .................................................. 98-29144

(51) Int. Cl.[7] .............................. H01J 31/00; H01J 1/62; H01J 9/00; H01J 9/24
(52) U.S. Cl. ........................ 313/506; 313/504; 313/505; 313/500; 445/24
(58) Field of Search ..................................... 313/495, 496, 313/498, 499, 500, 502, 503–509, 311, 582, 313; 315/169.3; 428/690, 917; 445/24, 25

(56) References Cited

U.S. PATENT DOCUMENTS

| | | | |
|---|---|---|---|
| 4,803,402 | * 2/1989 | Raber et al. | 313/509 |
| 5,444,330 | * 8/1995 | Leventis et al. | 313/506 |
| 5,483,120 | 1/1996 | Murakami | 313/506 |
| 5,701,055 | 12/1997 | Nagayama et al. | 313/504 |
| 5,742,122 | * 4/1998 | Amemiya et al. | 313/582 |
| 5,818,168 | 10/1998 | Ushifusa et al. | 313/582 |
| 5,900,694 | 5/1999 | Matsuzaki et al. | 313/582 |
| 5,962,970 | * 10/1999 | Yokoi et al. | 313/506 |
| 5,962,974 | * 10/1999 | Komaki et al. | 313/582 |
| 6,005,344 | * 12/1999 | Flemming | 313/503 |
| 6,013,983 | 1/2000 | Asano et al. | 313/582 |
| 6,023,125 | * 2/2000 | Yoshikawa et al. | 313/309 |

\* cited by examiner

Primary Examiner—Nimeshkumar D. Patel
Assistant Examiner—Mariceli Santiago
(74) Attorney, Agent, or Firm—Fleshner & Kim, LLP

(57) ABSTRACT

Effective and uniform driving of a large organic EL display panel is formed using a plurality of stripes for each of first electrodes and also for each of second electrodes. These stripes are electrically isolated from each other, which enables each group of pixels defined by a set of orthogonal stripes to be driven separately from the remaining groups of pixels. Efficient fabrication methods devised to construct the display panel are cost effective and suitable for mass production.

32 Claims, 28 Drawing Sheets

FIG.6
(a)
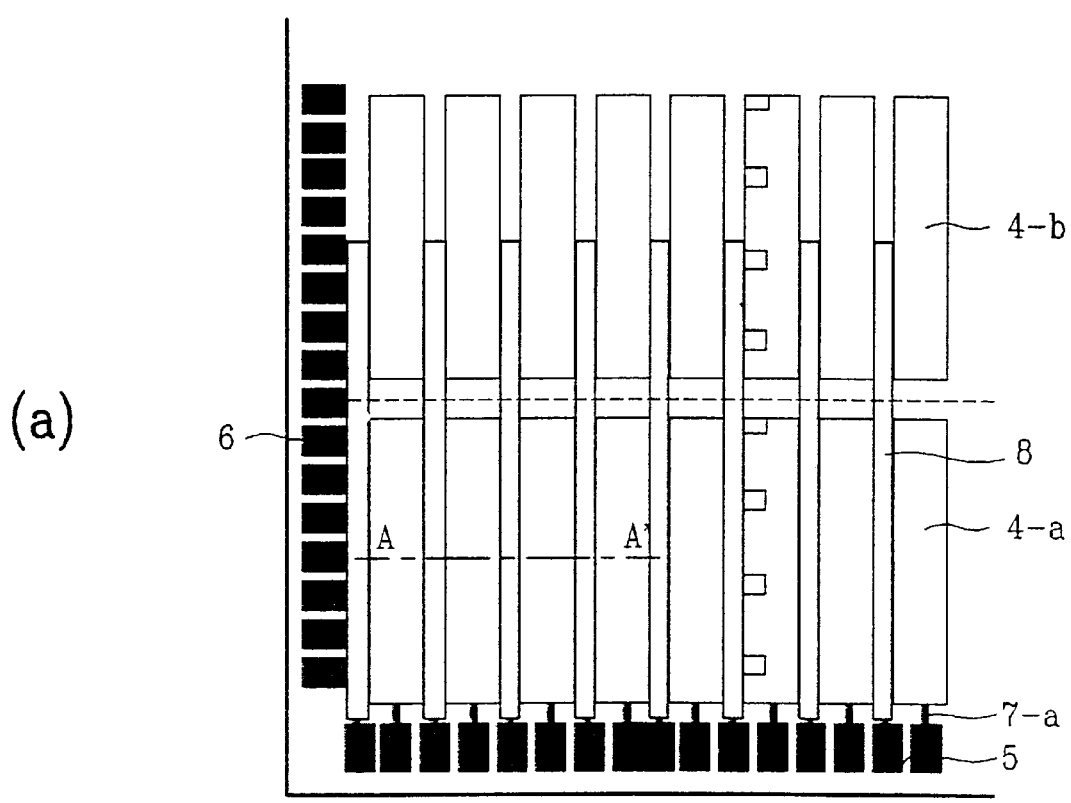
(b)
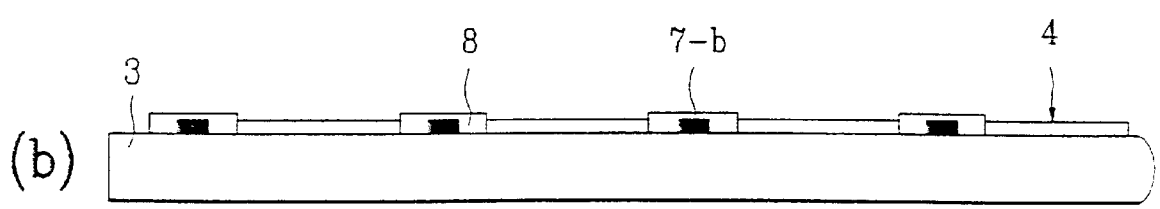

FIG.7
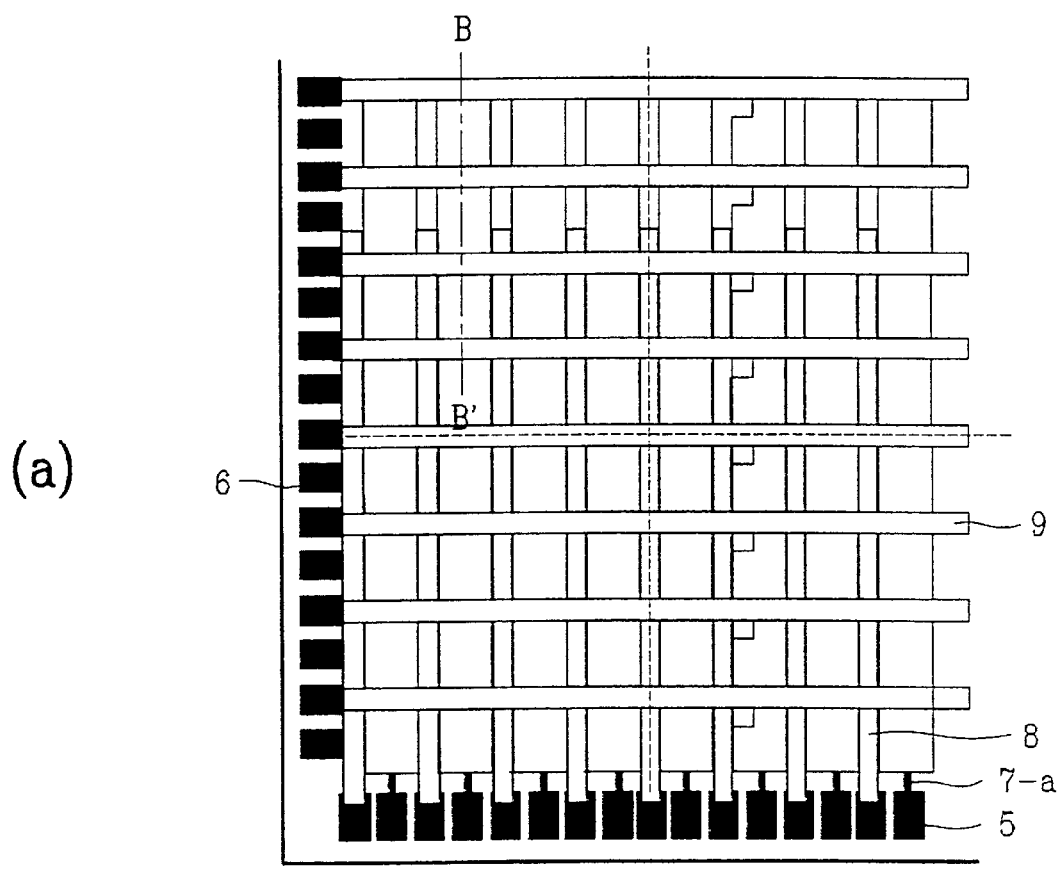
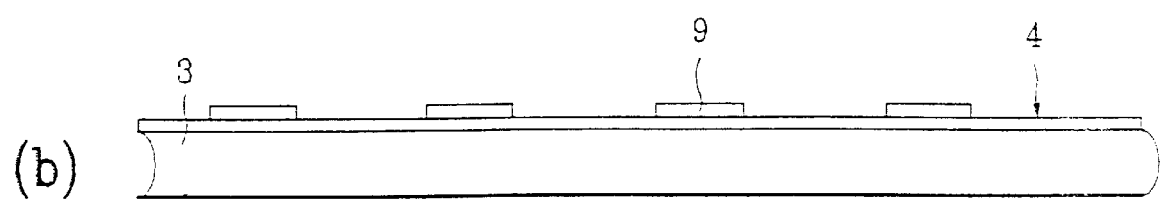

FIG.7-1
(a)
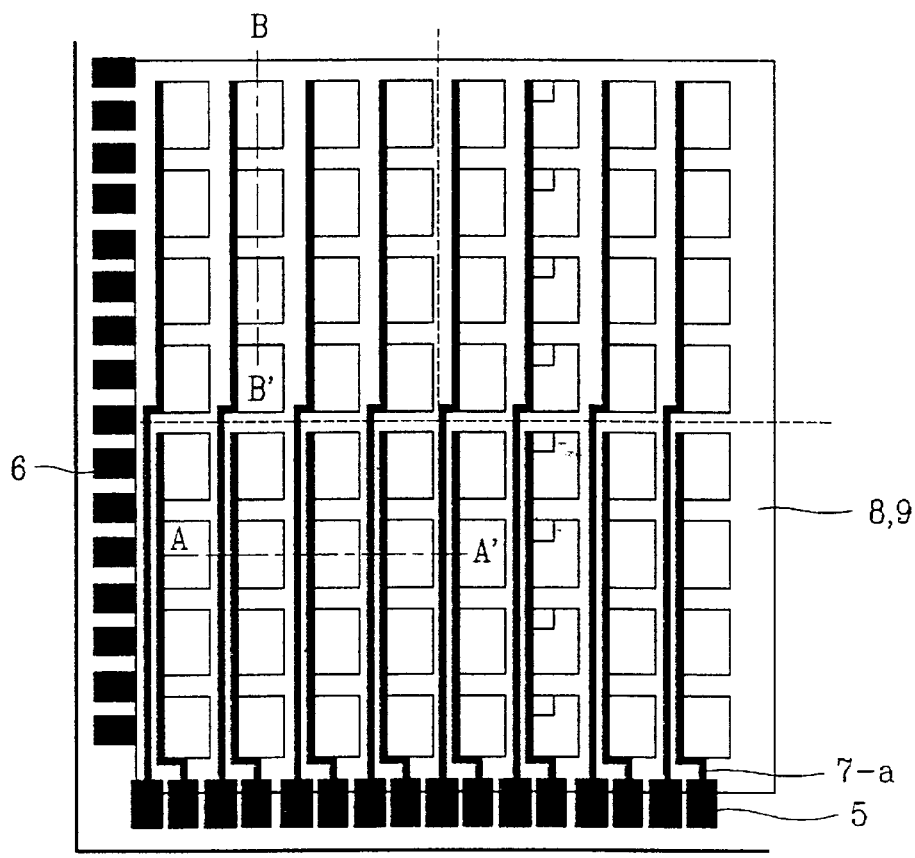
(b)
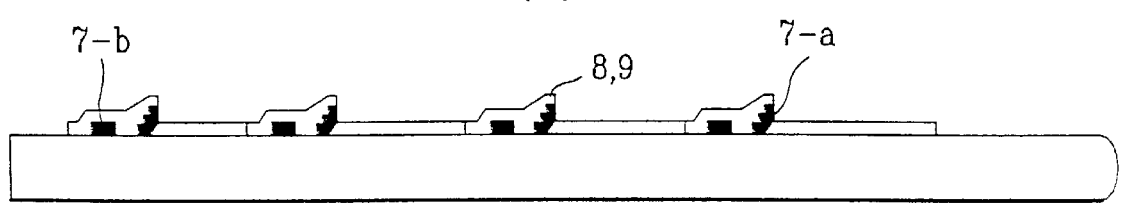
(c)
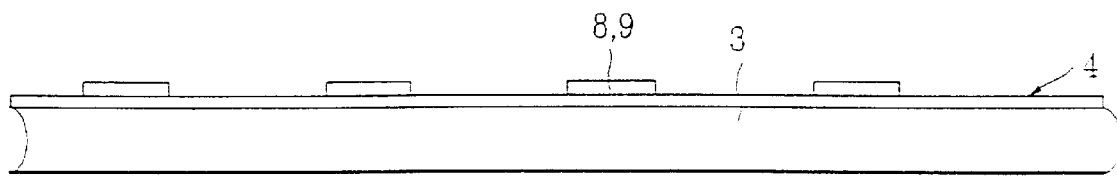

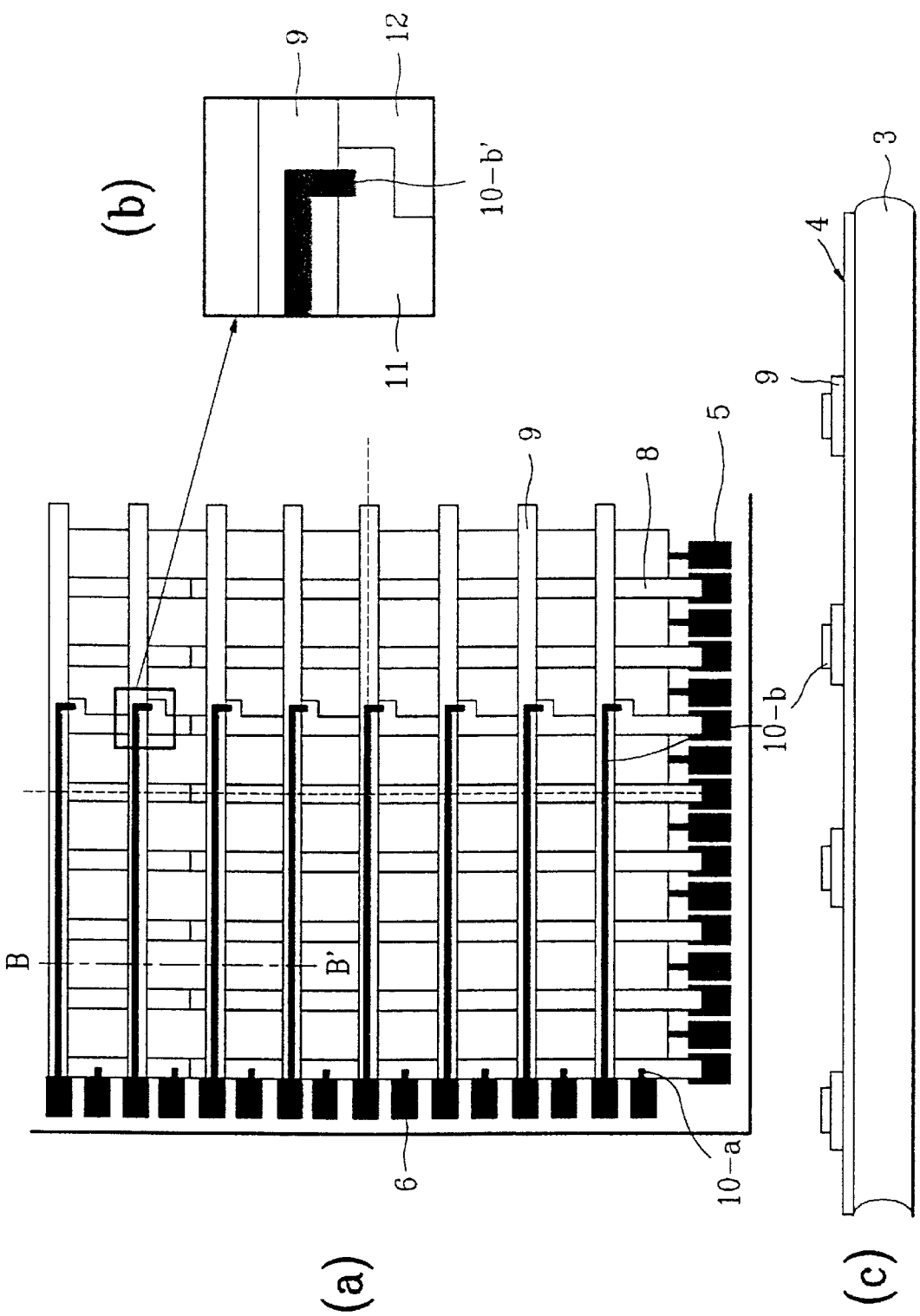

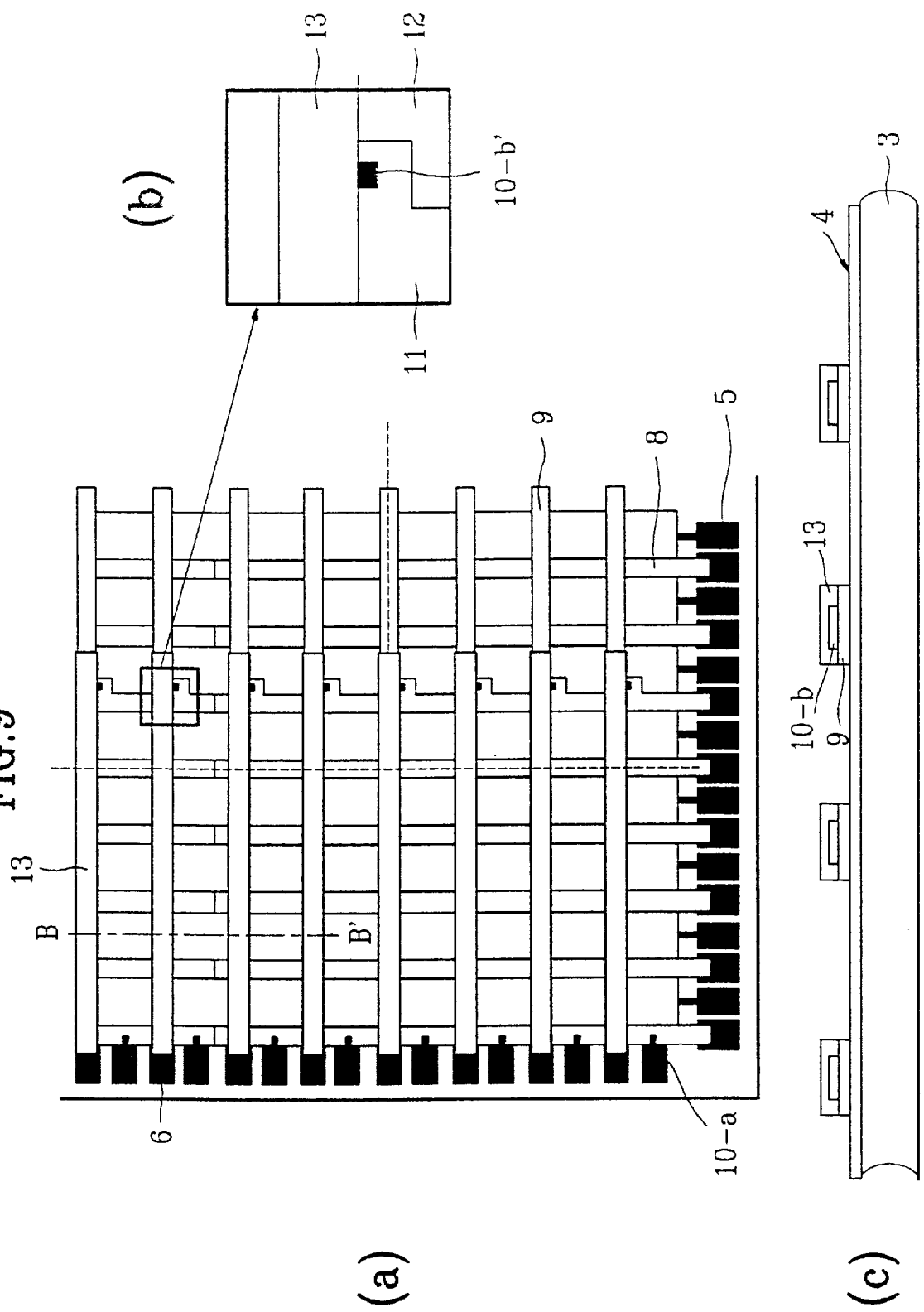

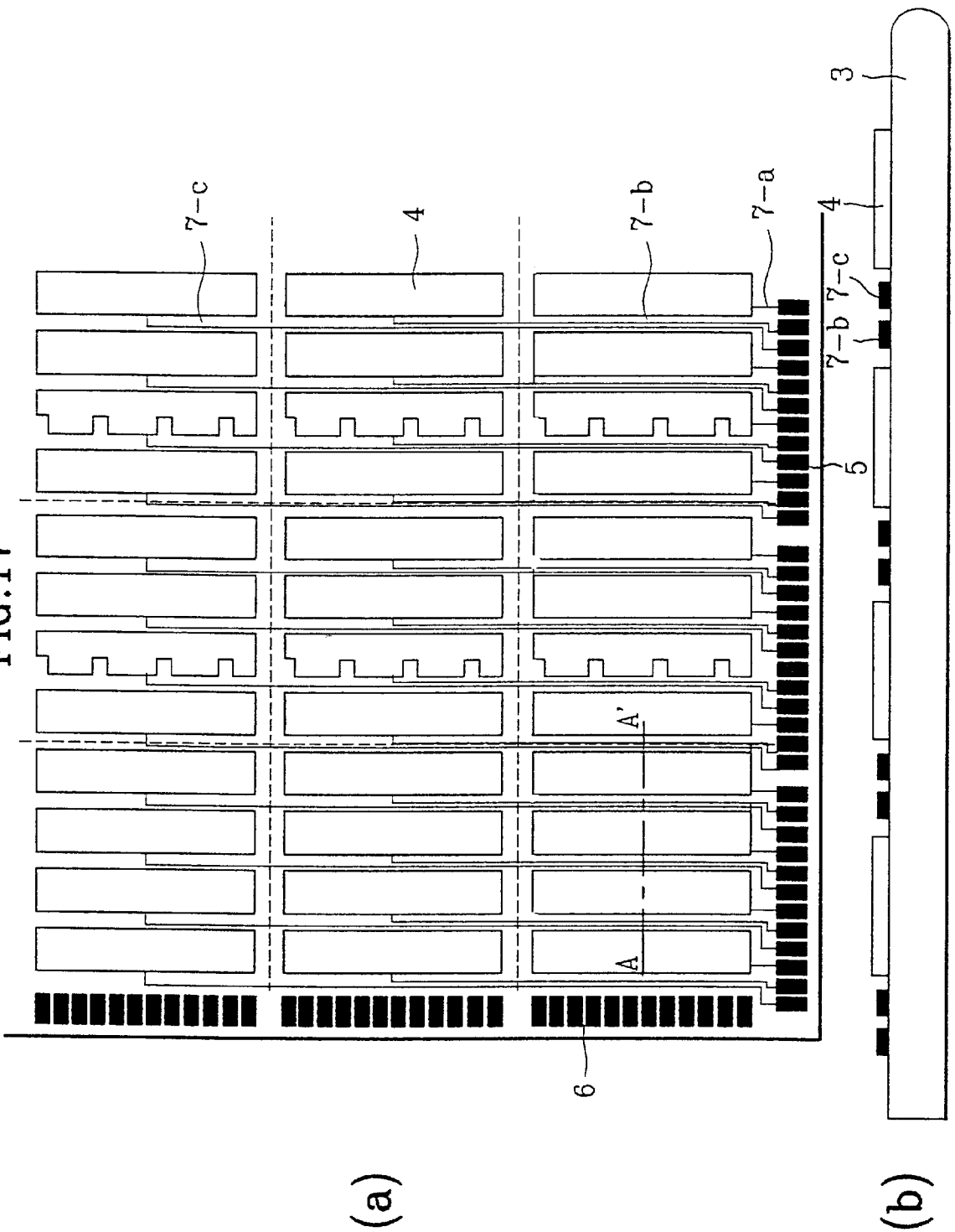

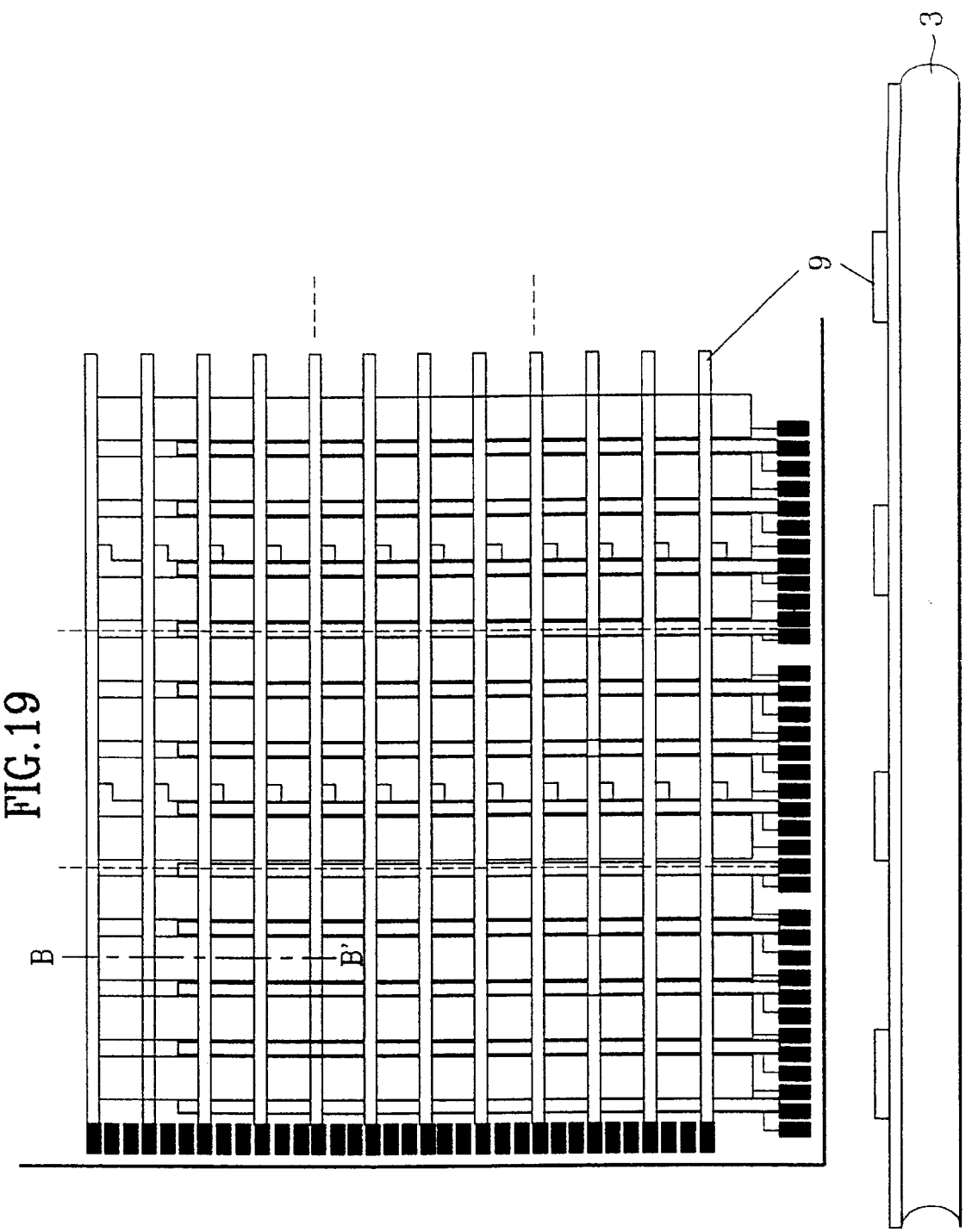

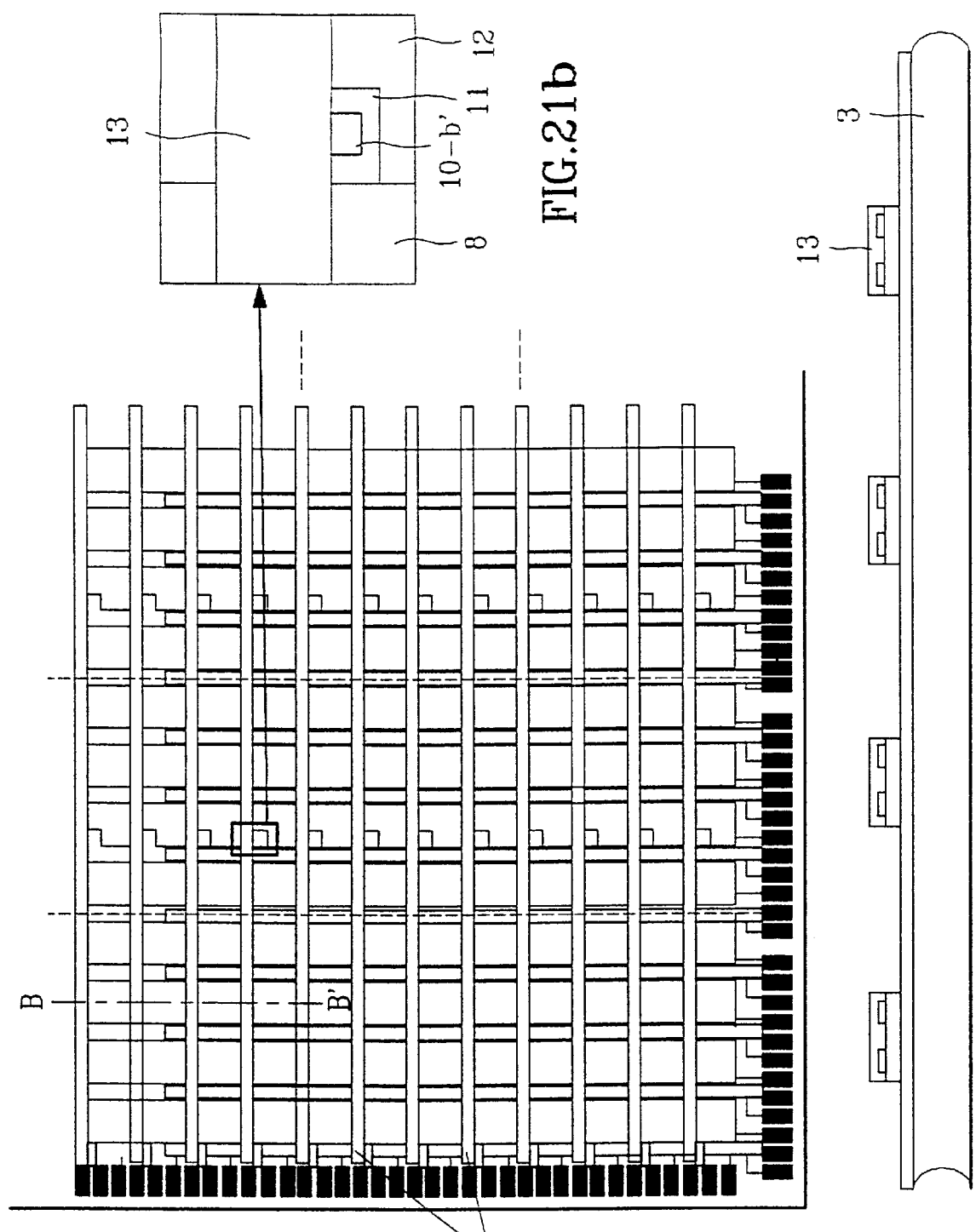

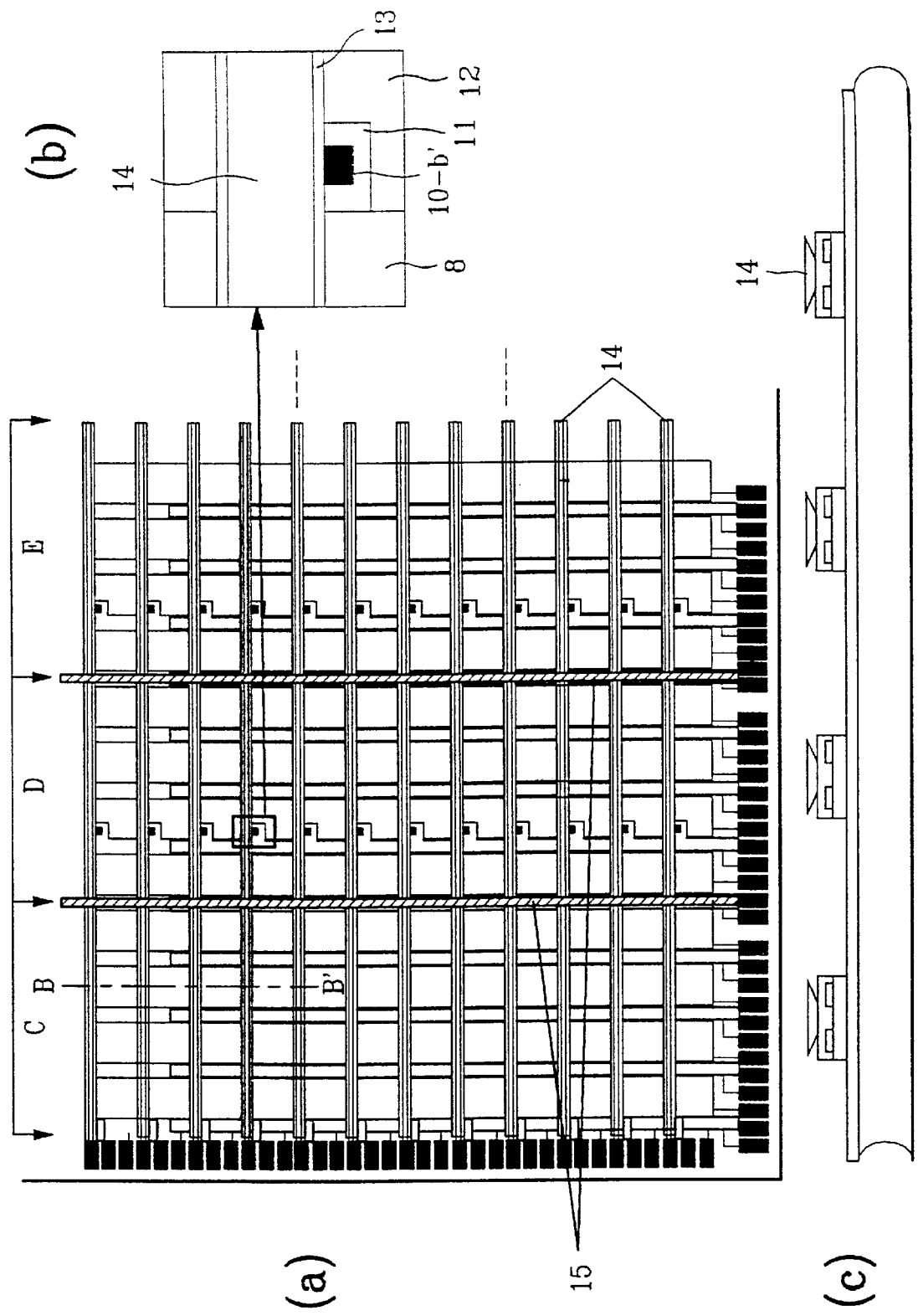

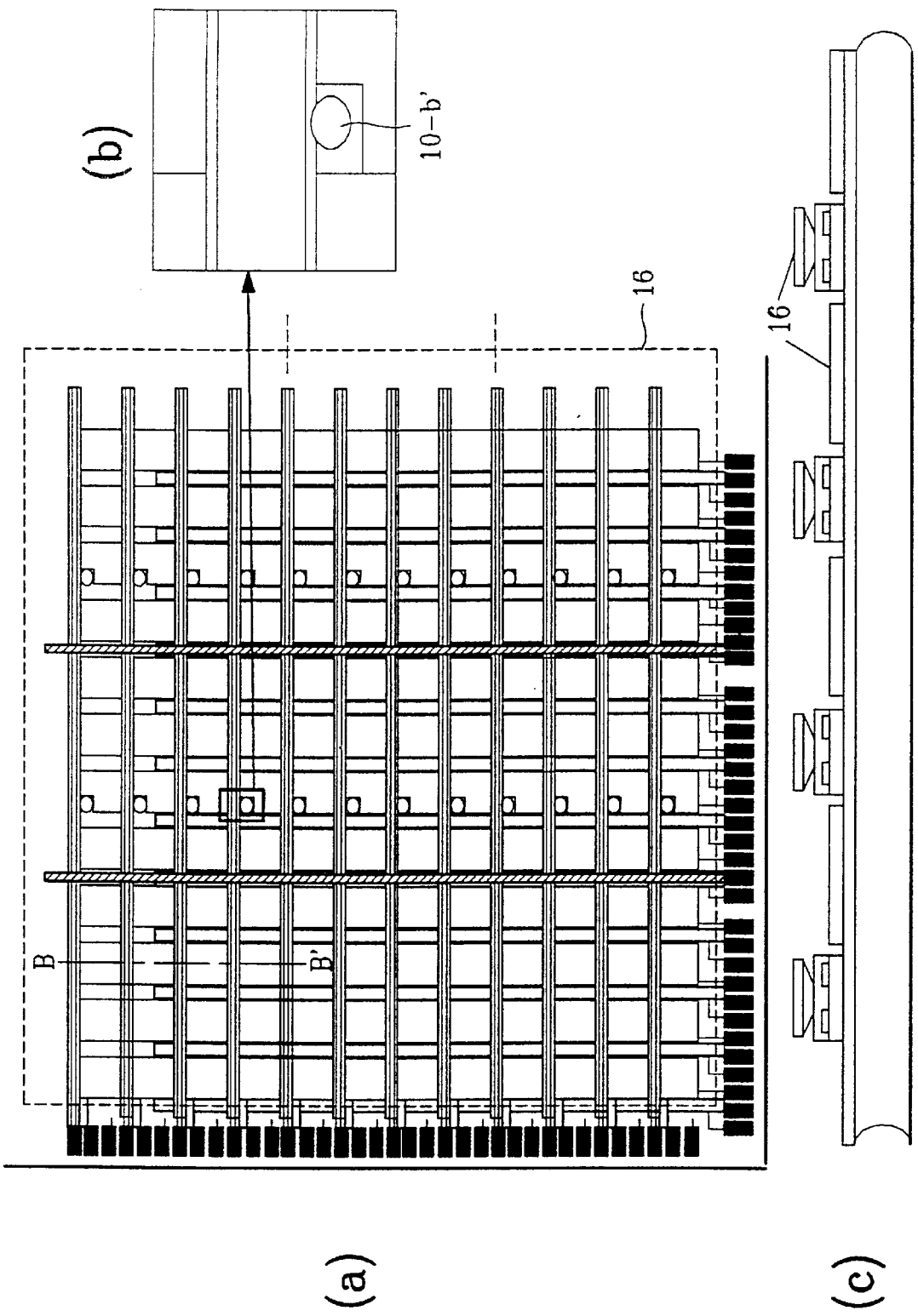

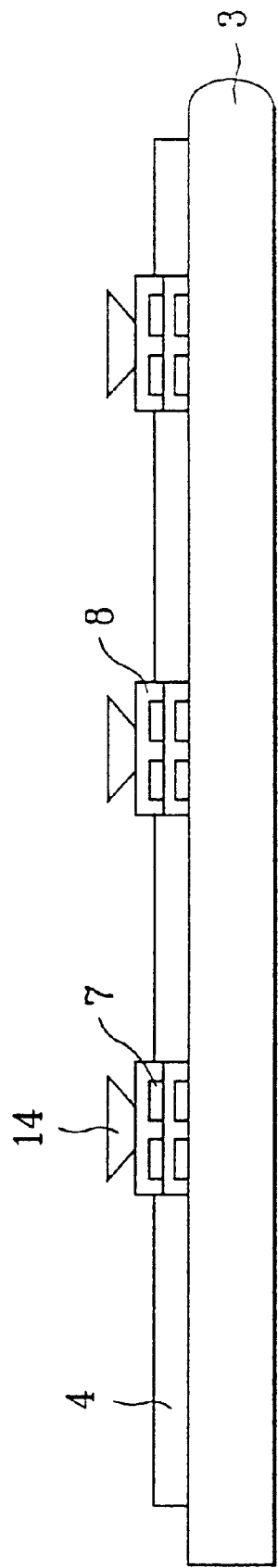
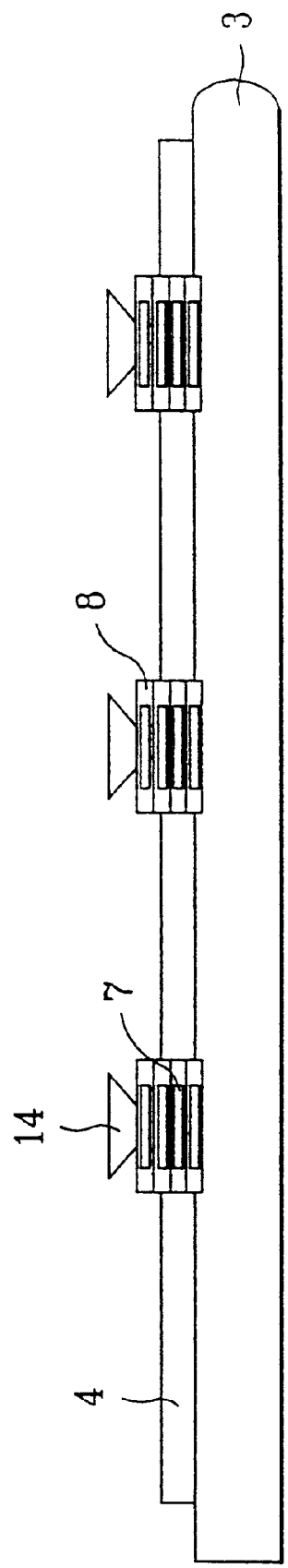

ORGANIC ELECTROLUMINESCENT DISPLAY PANEL WITH FIRST AND SECOND BUS ELECTRODES AND ELECTRICALLY INSULATING LAYERS

This application is a Continuation of Application No. 09/126,597 filed Jul, 31. 1998, now U.S. Pat. No. 6,140,765.

BACKGROUND OF THE INVENTION

1. Field of the Invention

The present invention relates to a display panel, and more particularly, an organic electroluminescent (hereinafter referred to as EL) display panel.

2. Background of the Related Art

The technology of organic EL devices, also called organic light emitting diodes (LEDs), has been rapidly advancing, and some prototype modules have been demonstrated at exhibitions. An example of an organic EL device is described in U.S. Pat. No. 5,701,055. Organic EL devices are extremely thin, matrix-addressable and operable at a relatively low voltage, typically less than 15 volts. Furthermore, they have additional features suitable for the next generation of flat panel displays (FPDs) such as, for example, little dependence on viewing angle and good device-formability on flexible substrates. One of the drawbacks of liquid crystal displays is that most of them require bright backlighting, which can be easily eliminated by the use of an organic EL display.

Organic LEDs differ fundamentally from conventional inorganic LEDs. While the charge transfer in inorganics is band-like in nature and the electron-hole recombination results in the interband emission of light, organic films are generally characterized by the low-mobility activated hopping transport and the emission is excitonic. Organic EL devices are also substantially different from conventional inorganic EL devices, especially in that organic EL devices are operable at low DC voltages.

A substantial amount of effort has been directed towards the efficiency improvement and color control of organic LEDs. Further, for commercialization and manufacturing of an organic EL device for various products and applications, considerations of manufacturability, uniformity, reliability, and systems issues is quite important. Moreover, for the applications to large flat panel displays, it is critical to have uniform emission over the whole display screen. Another important issue indirectly but closely associated with the fabrication of a large organic EL display panel is the difficulties associated with driving a large organic EL panel using a passive matrix addressing scheme. One way to drive an organic EL panel is to have organic function layers sandwiched between two sets of orthogonal electrodes, i.e. rows and columns. In this passive addressing scheme, the EL element serves both the display and switching functions. The diode-like nonlinear current-voltage characteristic of the organic EL element should, in principle, permit a high degree of multiplexing in this mode of addressing. However, the problems to be discussed below become apparent as an organic EL display panel becomes large.

First, it is well known that an RC time delay is significant in an organic EL display due to somewhat poor conductivity of indium tin oxide (ITO), a typical material for transparent electrode, and relatively large capacitance component of organic layers. As the panel size increases, the time delay becomes prohibitively large.

Further, an organic EL display element does not have an intrinsic memory requiring a very high peak luminance for a passive matrix addressing, which limits the number of rows of the display panel. The instantaneous peak luminance is proportional to (number of row) x (average luminance). To achieve an average display luminance of 100 $cd/m^2$, for example, the maximum number of rows will probably be limited to less than 500. The estimation is made with the assumption that a peak luminance is 50,000 $cd/m^2$, which is not trivial to achieve, and the device stability will certainly be a critical issue at that high luminance. In addition, the instantaneously high current causes large IR potential drops along the column and row buses, which causes the non-uniformity of brightness over the panel surface.

One solution to the problems discussed above may be an active addressing scheme as in a thin film transistor liquid crystal display (TFT-LCD). But an active matrix EL (AM-EL) is costly to fabricate, which makes the organic EL panel less competitive compared to other display technologies, e.g., plasma display panel (PDP), as the display size becomes large. Thus, it is highly in demand to devise a practical way to fabricate a large passive addressable organic EL panel.

The above references are incorporated by reference herein where appropriate for appropriate teachings of additional or alternative details, features and/or technical background.

SUMMARY OF THE INVENTION

An object of the present invention is to substantially obviate at least the problems due to limitations and disadvantages discussed in the background art.

Another object of the present invention is to improve the efficiency of a display panel.

Another object of the present invention is to improve the color control.

Another object of the present invention is to provide a uniform emission over an entire display screen.

A further object of the present invention is to uniformly form organic function layers over an entire active viewing area.

Still a further object of the present invention is to provide a high luminance.

Another object of the present invention is to provide a large flat panel display.

An object of the present invention is to provide a passive addressable organic electroluminescent display panel and a method for manufacturing the same.

A further object of the invention is to provide a large panel crated by sub-panels.

A still further object of the invention is to provide a symmetrical layout of bus electrodes.

A still further object of the invention is to provide contact windows for connection with electrodes and electrode buses.

The present invention may be achieved in a whole or in parts by an organic electroluminescent display panel having a plurality of emitting portions and comprises a transparent substrate; a plurality of first electrodes formed on the transparent substrate, each first electrode made up of a plurality of stripes which are electrically isolated from each other, each stripe electrically connected to a first bus electrode made up of a single or a plurality of electrically conducting materials, each first bus electrode, if necessary, vertically stacked with an electrically insulating layer in between, each of the stacked layers made up of one or a plurality of first bus electrodes arranged side by side with an electrically insulating gap in between; organic function layers formed on the first electrodes, including at least one organic EL medium layer; and a plurality of second electrodes formed on the organic function layers, each second electrode made up of a plurality of stripes which are electrically isolated from each other, each stripe electrically connected to a second bus electrode made up of a single or a plurality of electrically conducting materials, each second bus electrode, if necessary, vertically stacked with an electrically insulating layer in between, each of the stacked layers made up of one or a plurality of second bus electrodes arranged side by side with an electrically insulating gap in between.

The present invention may be also achieved in a whole or in parts by a method for manufacturing an organic EL display panel having a plurality of emitting portions, wherein the method comprises the steps of: forming a plurality of first electrodes, each first electrode made up of a plurality of stripes which are electrically isolated from each other; forming the first set of first bus electrodes, each first bus electrode electrically connected to a corresponding first electrode; forming the second set of first bus electrodes on top of an insulating layer which is, in turn, formed on the first set of first bus electrodes, or alternatively forming the second set of first bus electrodes laterally next to corresponding first bus electrodes of the first set, and, in any cases, each first bus electrode electrically connected to a corresponding first electrode; repeating thereafter, if necessary, the formation of further sets of first bus electrodes in such a way as described in the above; forming the first set of second bus electrodes and their connection pads by which second bus electrodes are to be electrically connected to corresponding second electrodes being deposited in a following step; forming the second set of second bus electrodes on top of an insulating layer which is, in turn, formed on the first set of second bus electrodes, or alternatively forming the second set of second bus electrodes laterally next to corresponding second bus electrodes of the first set, and, in any cases, the second set of second bus electrodes having connection pads by which the second bus electrodes are to be electrically connected to corresponding second electrodes being deposited in a following step; repeating thereafter, if necessary, the formation of further sets of second bus electrodes in such a way as described in the above; laminating, at least on the first electrodes, organic function layers including at least one organic EL medium layer; etching out portions of organic function layers deposited on top of the connection pads for second electrodes to expose the surface of the connection pads; and forming second electrodes on top of the organic function layers and the exposed surface of the connection pads, making electrical connections between the second electrodes and corresponding connection pads.

The present invention may be further achieved in a whole or in parts by an organic electroluminescent (EL) display panel comprising: a plurality of emitting portions laminated between a plurality of first and second electrodes, each of the plurality of first and second electrodes being a plurality of conductive layers arranged in a matrix of at least one row and at least one column and the conductive layers being electrically isolated from each other, wherein the matrix of at least one row and at least one column is divided into n×m sub-panels, where n and m are integers equal to at least one.

The present invention may be further achieved in a whole or in parts by an organic electroluminescent (L) display panel comprising: a plurality of sub-panels divided into a plurality of emitting portions; formed on a substrate on which a plurality of first electrodes corresponding to the sub-panels and a plurality of first signal buses coupled to corresponding first electrodes are formed; a plurality of second signal buses insulatively projecting from the substrate for exposing at least portions of the first electrodes respectively; at least one of first organic function layers, second organic function layers to and third organic function layers formed on the exposed portions of the first electrodes, each of the first organic function layers, second organic function layers and third organic function layers including at least one organic electroluminescent medium; and a plurality of second electrodes formed on said at least one of first, second and third organic function layers and coupled to corresponding second signal buses.

The present invention may be further achieved in a whole or in parts by a method of making an organic electroluminescent display panel comprising the steps of: forming a plurality of first electrodes in an array of rows and columns on a substrate, each first electrode being electrically isolated from each other; forming a plurality of first signal buses between adjacent first electrodes in a column direction and coupled to corresponding first electrodes; forming a plurality of second signal buses in a row direction and insulatively projecting from the substrate for exposing at least portions of the first electrodes respectively; forming at least one of first, second and third function layers on the exposed portions of the first electrodes, each of the first, second and third organic function layers including at least one organic electroluminescent medium; and forming a plurality of second electrodes on the at least one of first, second and third organic function layers and coupled to corresponding second signal buses.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 5(a) is a close-up view of the four subpanels designated as 2-f in FIG. 4, and FIG. 5(b) illustrates a cross-sectional view taken along the line A–A' in FIG. 5(a);

FIG. 5-1 depicts another way of electrically connecting stripes of first electrodes and corresponding contact pads;

FIG. 6 is a plan view showing the process of covering first bus electrodes with an insulating layer;

FIG. 7(a) is a schematic view illustrating the process of forming an insulating buffer layer for second bus electrodes, and FIG. 7(b) illustrates a cross-sectional view taken along the line B–B' in FIG. 7(a);

FIG. 7-1(a) illustrates a process wherein the two steps concerning FIGS. 6 and 7 are performed together in a step; FIGS. 7-1(b) and 7-1(c) show cross-sectional views taken along the lines A–A' and B–B', respectively;

FIG. 8(a) is a plan view illustrating the process of forming second bus electrodes; FIG. 8(b) is an enlarged view, and FIG. 8(c) illustrates a cross-sectional view taken along the line B–B' in FIG. 8(a);

FIG. 9 is a plan view illustrating the process of forming an insulating layer for second bus electrodes;

FIG. 17(a) is a schematic view illustrating the process of connecting stripes of first electrodes and corresponding contact pads, and FIG. 17(b) illustrates a cross-sectional view taken along the line A–A' in FIG. 17(a);

FIG. 19 is a schematic view illustrating the process of forming an insulating buffer layer for second bus electrodes;

FIG. 21 is a plan view illustrating the process of forming an insulating layer for second bus electrodes;

FIG. 22 illustrates the process of forming electrically insulating ramparts for separating second electrodes laterally and also those for isolating the groups of second electrodes in C, D and E regions;

FIG. 23 illustrates the process of laminating organic function layers and exposing a part of second bus electrode 10-b' by etching out organic function layers on top of said bus electrode 10-b';

FIG. 25 is a sectional view illustrating the prototypical methods of forming a multilayer of second bus electrodes: (a) two lanes of bus electrode per layer and (b) a single lane per layer.

DETAILED DESCRIPTION OF PREFERRED EMBODIMENTS

Figure 1:
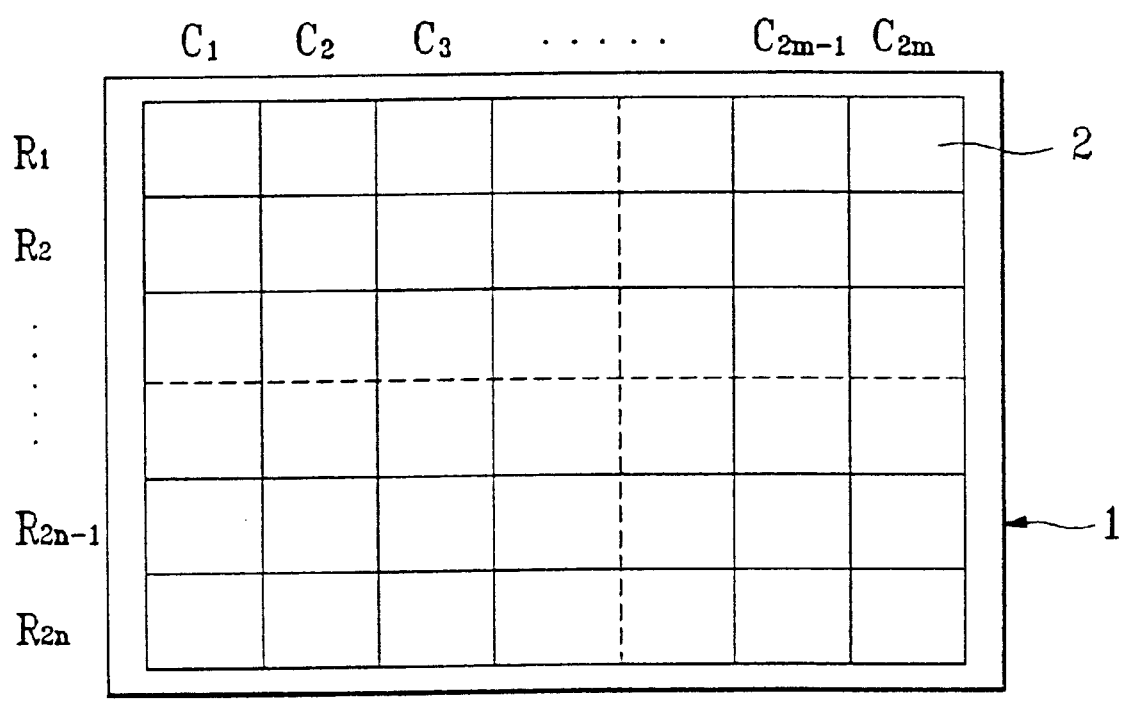
FIG. 1 illustrates a plan view of an organic EL display panel in accordance with a one of the preferred embodiments of the present invention.
Figure 2:
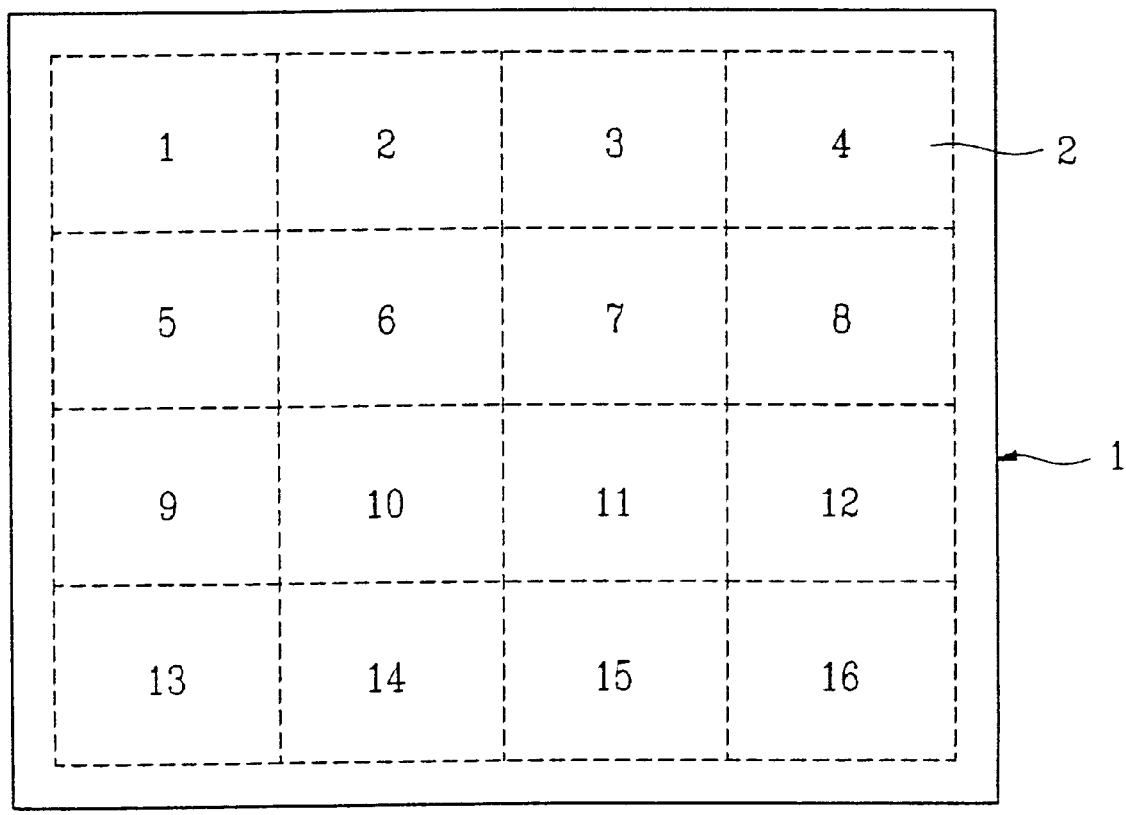
FIG. 2 shows a plan view of a display panel having (4×4) sub-panels.

FIG. 1 schematically illustrates a plan view of an organic EL display panel in accordance with a preferred embodiment of the present invention. The organic EL display panel 1 has a large viewing area which is divided into a plurality of subpanels 2 of m×n, i.e., m columns and n rows, wherein m and n are integers equal to or greater than 1 and each sub-panel is divided into a plurality of emitting portions. Each sub-panel is electrically driven separately. FIG. 2 shows an exemplary display panel having (4×4) sub-panels. The panel 1 has an active viewing area which is constituted of sixteen sub-panels 2. A series of fabrication steps devised in the present invention have been illustrated in FIGS. 3–14 for an exemplary display panel having (4×4) sub-panels.

Figure 3:
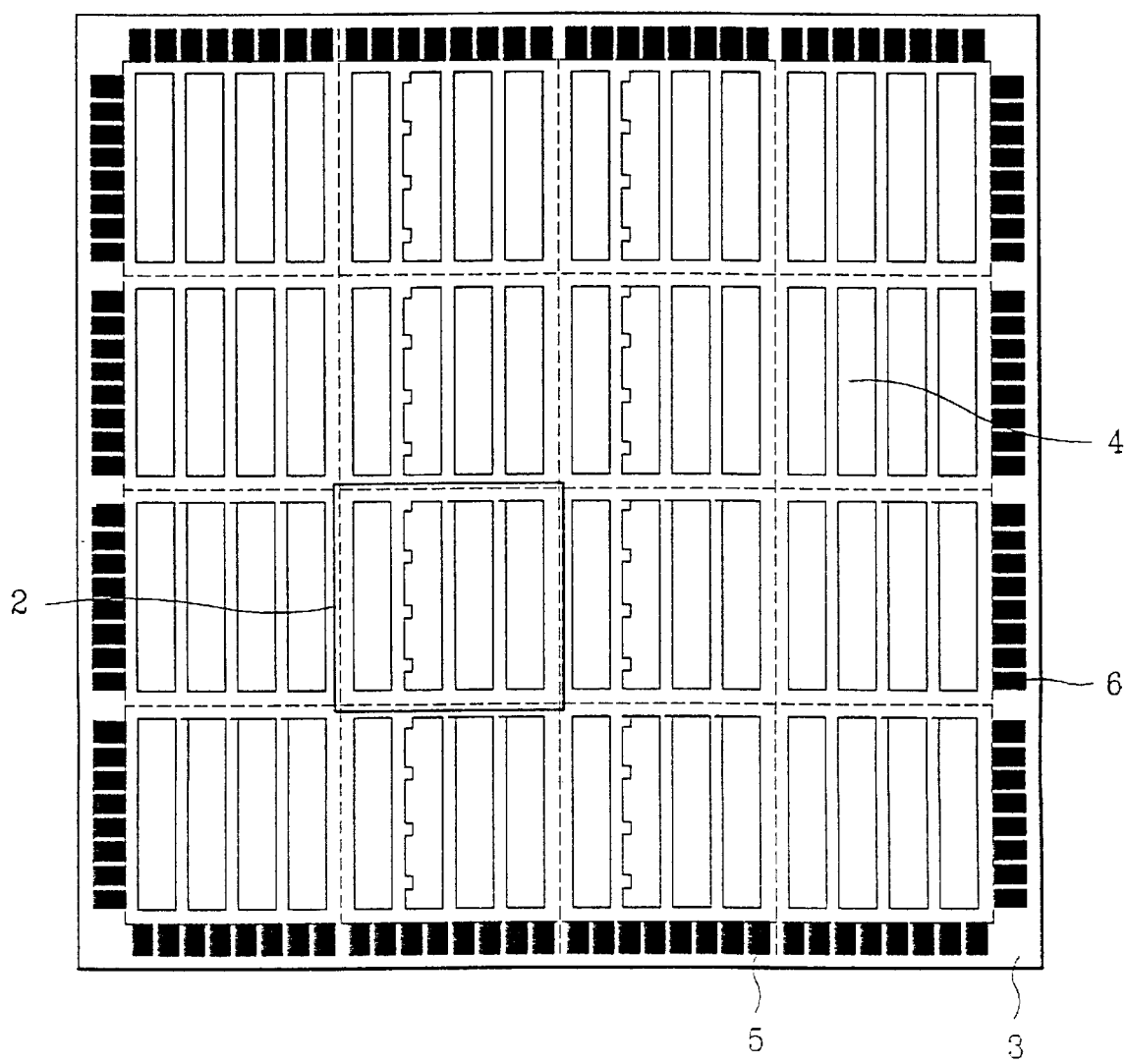
FIG. 3 is a schematic view illustrating the process of forming a plurality of first electrodes and a plurality of contact pads for first and second electrodes.

In the first processing step (FIG. 3), a layer of transparent conductor(s), typically indium tin oxide (ITO), is deposited on a transparent, insulating substrate 3 and the deposited layer is patterned into a plurality of stripes 4 by photolithography. The first electrode is different from an anode used in a typical matrix addressing in that each first electrode is divided into a plurality of stripes, e.g., 4 stripes. Each stripe of an electrode is electrically isolated from others, which is utilized to drive each sub-panel 2 of the display panel separately. FIG. 3 also shows a plurality of contact pads 5 and 6 for first and second electrodes, respectively, formed on the transparent substrate. The contact pads may be formed simultaneously during the formation of the first electrodes 6.

Figure 4:
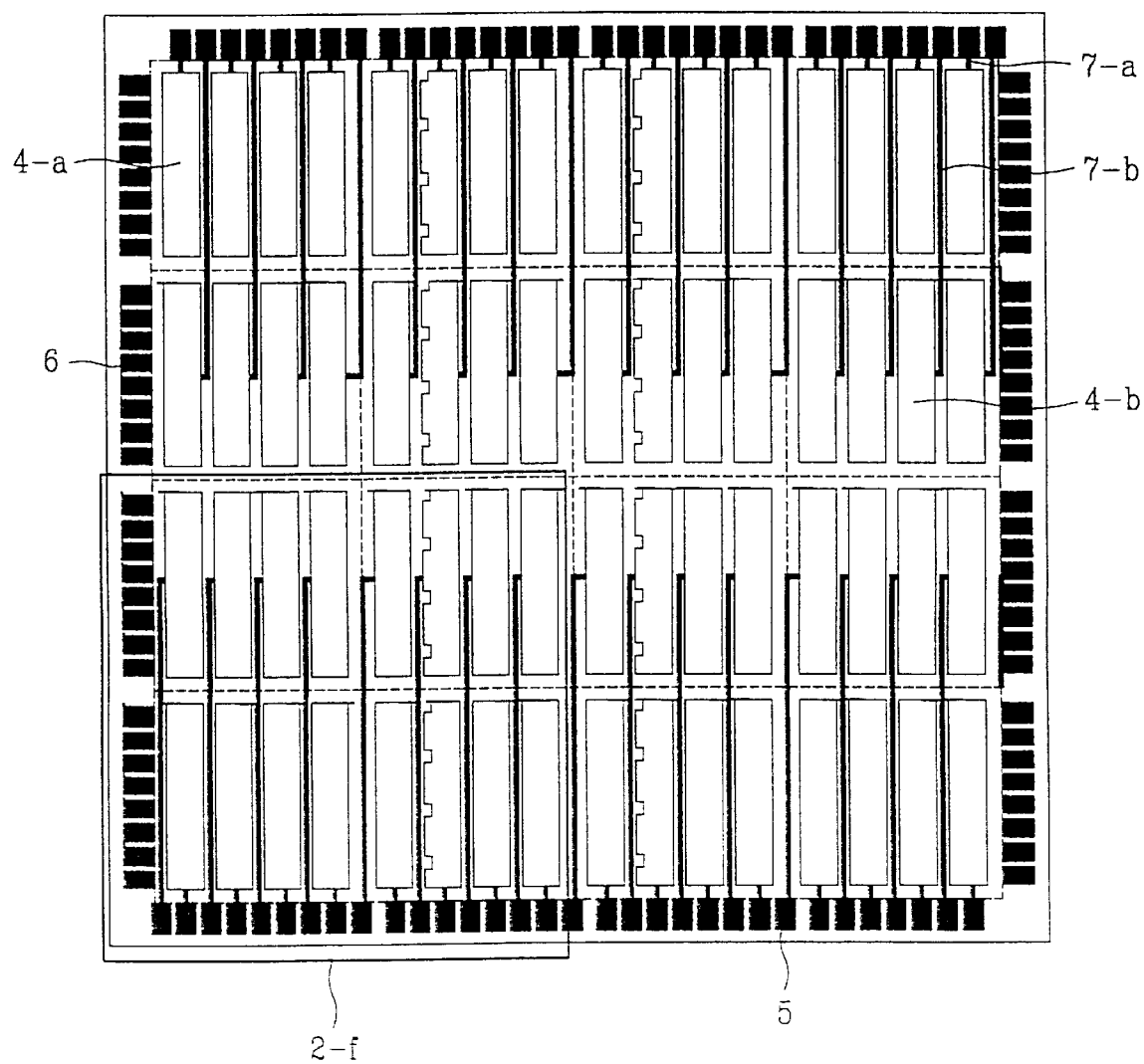
FIG. 4 is a schematic view illustrating the process of electrically connecting stripes of first electrodes and corresponding contact pads.

Next, the electrical connections between the stripes of the first electrodes and the corresponding contact pads are made through the first bus electrodes. The short connections 7-a between the outer stripes 4-a and the corresponding contact pads 5 are also shown in FIG. 4, but the connections may be simply made during the previous step by patterning ITO in such a shape that the two are connected in an alternative embodiment. The long connections between the inner stripes 4-b and the corresponding contact pads 5 are made through first bus electrodes 7-b, which are formed preferably of a highly conductive metal such as aluminum or its alloys. There are several different ways to form the first bus electrodes 7-b, and one of the preferred methods is to form the bus electrode only on the selective position using a lift-off process. The film growth may be performed using any of vapor deposition, e-beam evaporation, RF sputtering, chemical vapor deposition (CVD), spin coating, dipping, Dr. blade method, electro—and electroless platings, screen printing method, etc. FIG. 5(a) is a close-up view of four sub-panels designated as 2-f in FIG. 4, and FIG. 5(b) illustrates a cross-sectional view taken along the line A–A' in FIG. 5(a).

Figure 5:
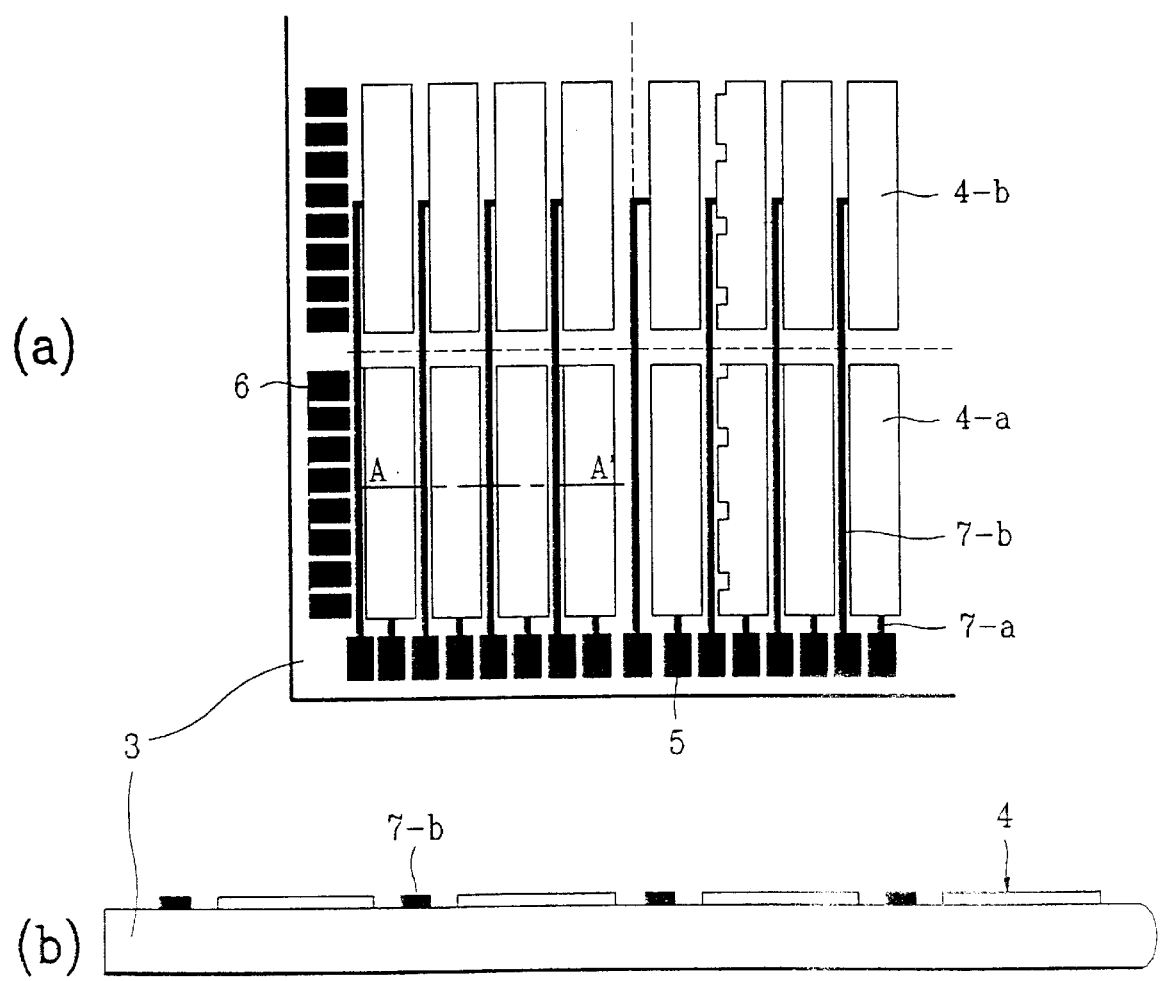
Figures 1, 5:
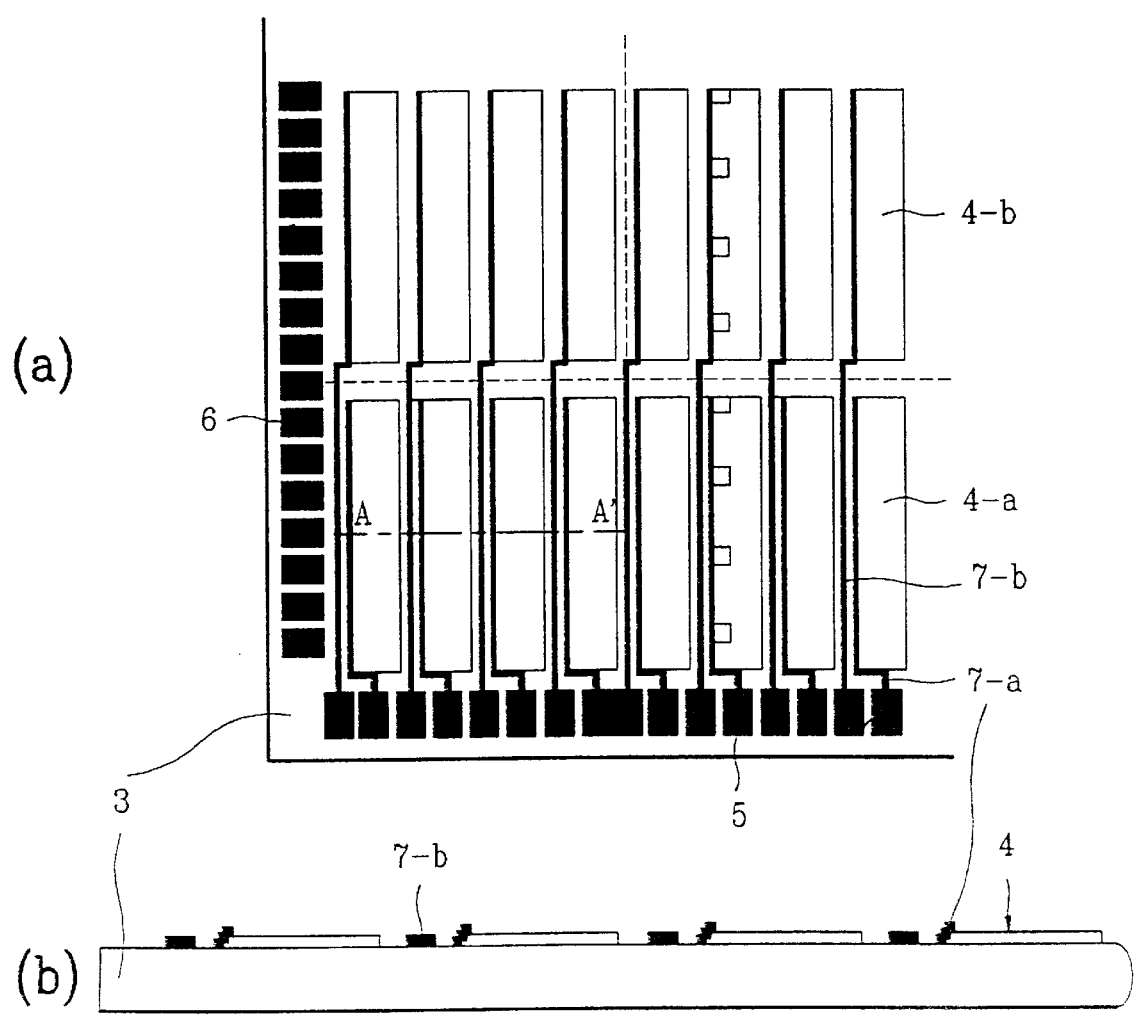

The IR potential drops along a long side of each rectangular-shaped stripe of the first electrodes can be significantly reduced by increasing the contact area between each of the first bus electrodes and a corresponding stripe of the first electrodes, which thereby makes a contribution towards a uniform emission of a sub-panel. In a sense, the first bus electrode serves as an auxiliary electrode for a stripe of first electrode because the electrical resistance of ITO, typically used for a first electrode, is much larger than that of a metal used for a bus electrode. Alternatively, each bus electrode can be formed along a long side of corresponding rectangular-shaped stripe, as shown in FIG. 5-1, making the two in electrical contact over the entire length of a long side of the stripe or over a substantial fraction of the whole length of the long side. The contacts can be either continuous or evenly distributed lengthwise along the long side of the stripe. As seen in FIG. 5-1, an electrode 7-*a* entering gages a notched edge portion of electrode 4 forming a plurality of notches.

In the next step, a layer of electrically insulating material (s) is formed on the top of the first bus electrodes 7-*b* (see FIG. 6). The layer 8 is required to be mechanically and chemically stable, and may be made of organic or inorganic insulating material(s). Preferred materials may be inorganic compounds such as silicon oxide and silicon nitride, and the film growth may be performed using any of vapor deposition, e-beam evaporation, RF sputtering, chemical vapor deposition (CVD), spin coating, dipping, Dr. blade method, electro- and electroless platings, screen printing method, etc.

FIG. 7(*a*) is a schematic view illustrating the process of forming an insulating buffer layer on top of which second bus electrodes are to be formed orthogonal to first bus electrodes in the following step. The role of the buffer layer 9 is to electrically isolate the second bus electrodes from first electrodes. The materials and film growth methods used to form said buffer layer may be basically the same as those for the insulating layer 8 in FIG. 6. The buffer layer may be formed together with the insulating layer 8 in the previous step (see FIG. 7-1) in an alternative embodiment.

In the next step, the second bus electrodes are formed to be orthogonal to first bus electrodes, as shown in FIG. 8. The role of the bus electrodes is to electrically connect contact pads 6 and second electrodes which are to be formed in the next process. The short connections 10-*a* may be omitted, depending on the structural design employed in an alternative embodiment. The long connections 10-*b* are formed mostly on top of the insulating layer 9, and, as shown in FIG. 8(*b*), a part of the bus electrode (10-*b*') is formed on an open area 11 which is not covered with the first electrode layer 4 (ITO). The second bus electrodes can be formed using the same materials and film growth methods as for the first bus electrodes.

Next, an insulating layer is formed on top of the second bus electrodes as in FIG. 9. Depending on the structural design adopted, the insulating layer 13 may be omitted. The materials and fabrication methods of the insulating layer are basically the same as those described earlier. In an alternative embodiment, the second bus electrodes may be formed before the first bus electrodes.

Depending on the mode of display and pixelation scheme adopted, next processing steps may vary substantially. As an example, if one chooses to separate adjacent pixels using electrically insulating ramparts, the ramparts may be formed on top of the insulating layer for either first or second bus electrodes, whichever formed later. Further, the first or second bus electrodes define the area for forming the organic layers, and the ramparts may be omitted depending on the method for the display and pixelation scheme.

For the fabrication of a monochrome display, a series of organic function materials are to be simply laminated. But the use of additional shadow mask(s) may be required for the construction of a multi or full color display: (1) putting a shadow mask onto the top surfaces of the ramparts or the bus electrodes, the shadow mask having a plurality of openings, each exposing one of either the first or second electrodes, whichever suitable, between the ramparts or the bus electrodes, and aligning the openings to the electrodes respectively; (2) depositing a first organic EL media through the openings onto the electrodes between the ramparts respectively, thereby forming a first (R) organic function layers; (3) after realigning the shadow mask, repeating the process (2) to form a second (G) and third (B) organic function layers; and (4) forming at least one second electrode on the ramparts and the organic function layers.

Figure 10:
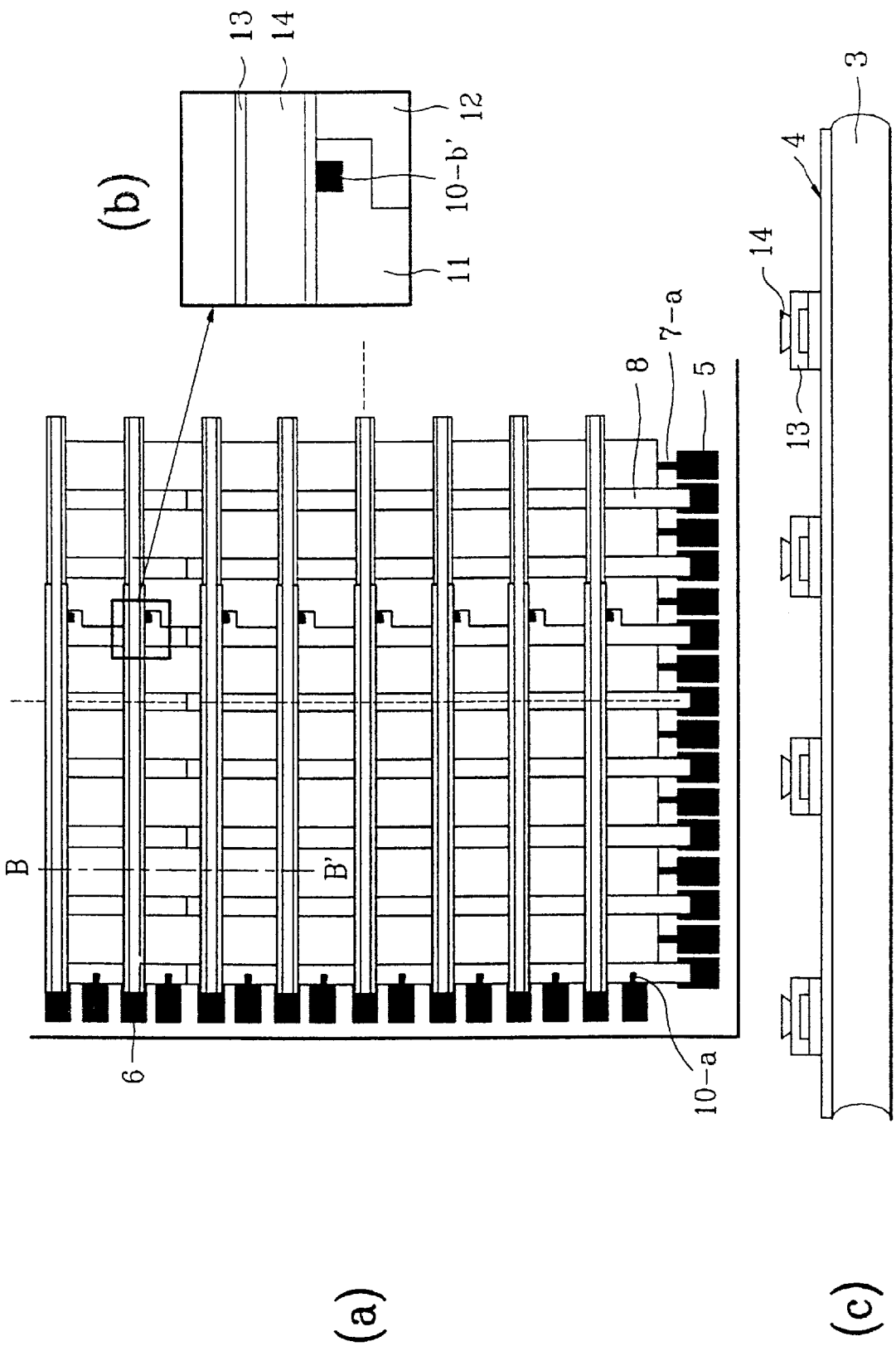
FIG. 10 illustrates the process of forming electrically insulating ramparts for pixelation.
Figure 11:
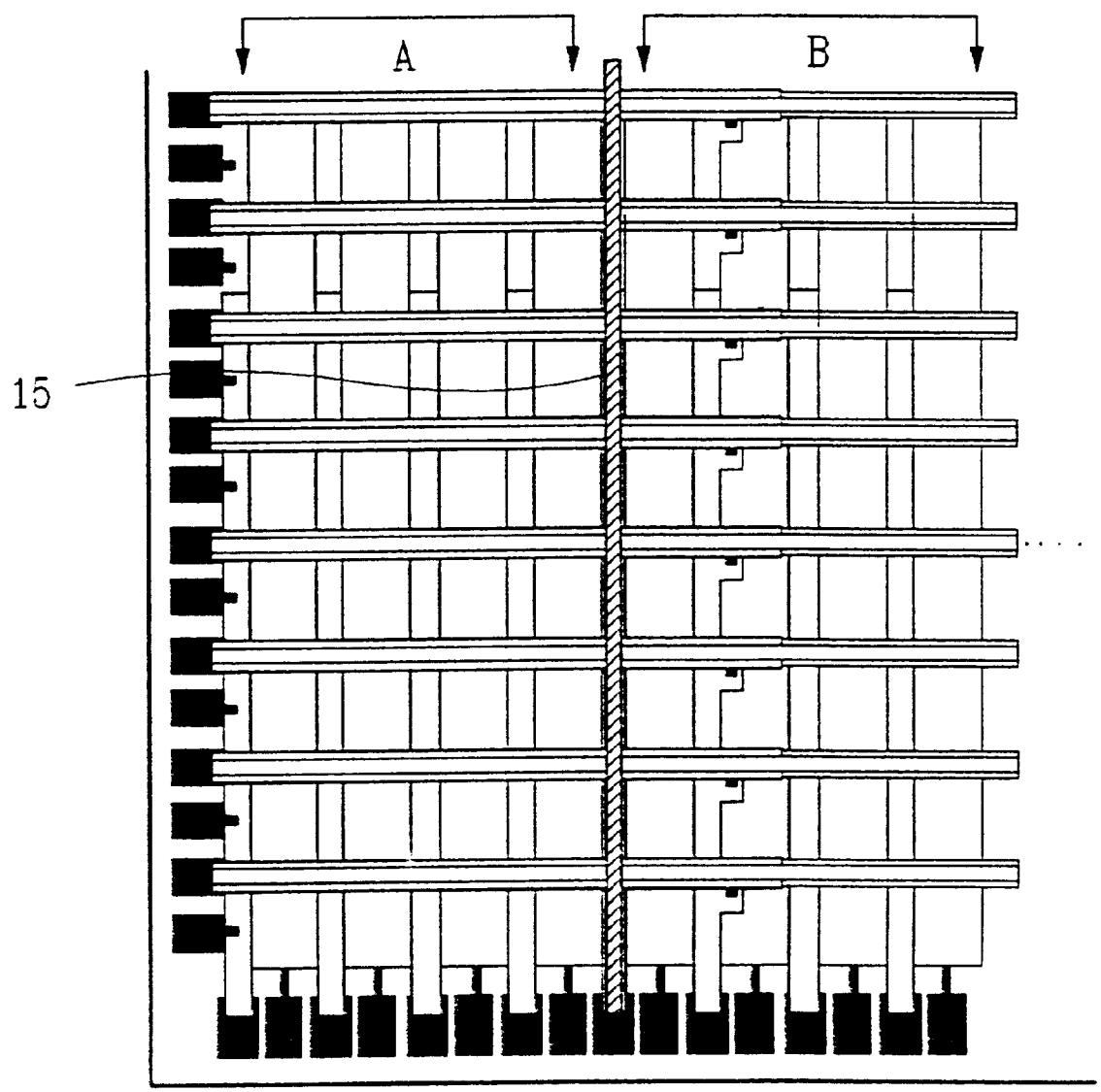
FIG. 11 exhibits the process of forming electrically insulating ramparts for electrically isolating second electrodes in A region from those in B region.

FIG. 10 illustrates the process of forming electrically insulating ramparts for pixelation as described in the above. The ramparts 14 are formed on top of the insulating layer 13 which serves as a buffer layer here. An additional rampart 15 may be required to electrically isolate second electrodes in A region from those in B region, as illustrated in FIG. 11.

Figure 12:
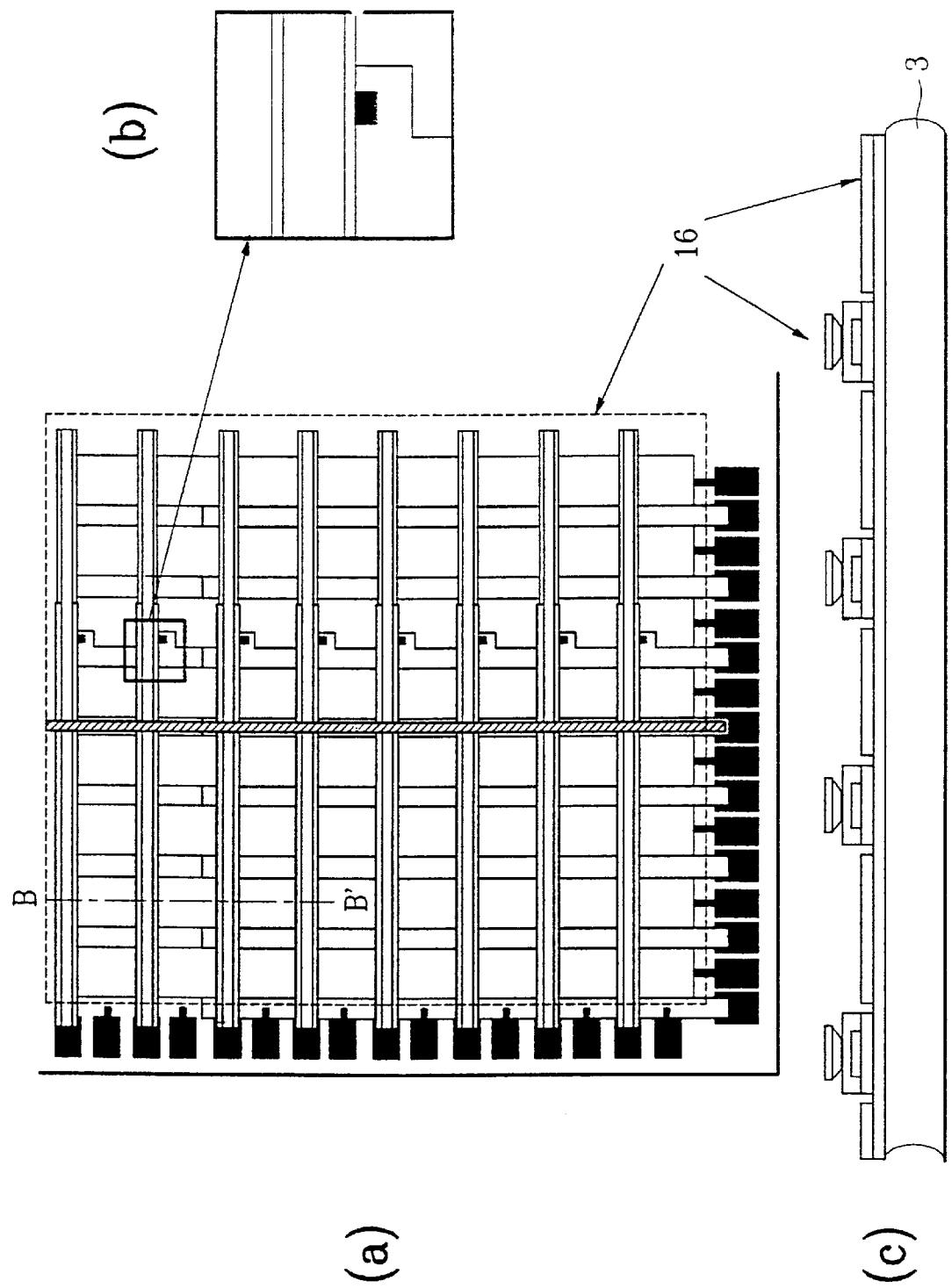
FIG. 12(a) illustrates the process of laminating organic function layers.
FIG. 12(b) is a blow-up.
FIG. 12(c) shows a cross-sectional view taken along the line B–B' in FIG. 12(a)

Next, the organic function layers 16 are laminated as seen in FIG. 12. An exemplary green-emitting device may have organic function layers of: (1) a hole injecting buffer layer of copper phthalocyanine (CuPc) typically 10 nm~20 nm thick, (2) a hole transporting layer of N,N'-diphenyl-N,N'-bis(3-methylphenyl)-(1,1'-biphenyl)4,4'-diamine (TPD) typically 30 nm~50 nm thick, and (3) an emitting layer of tris(8-hydroxyquinolate)aluminum ($Alq_3$) 40 nm~60 nm thick which is often doped with a fraction of an emitting dye such as coumarin 6 or quinacridone. One of the preferred methods to fabricate a full color display panel is to laminate each of red, green and blue emitting materials onto the corresponding pixels step by step using a plurality of ramparts or the bus electrodes and shadow mask(s), as described earlier.

Figure 13:
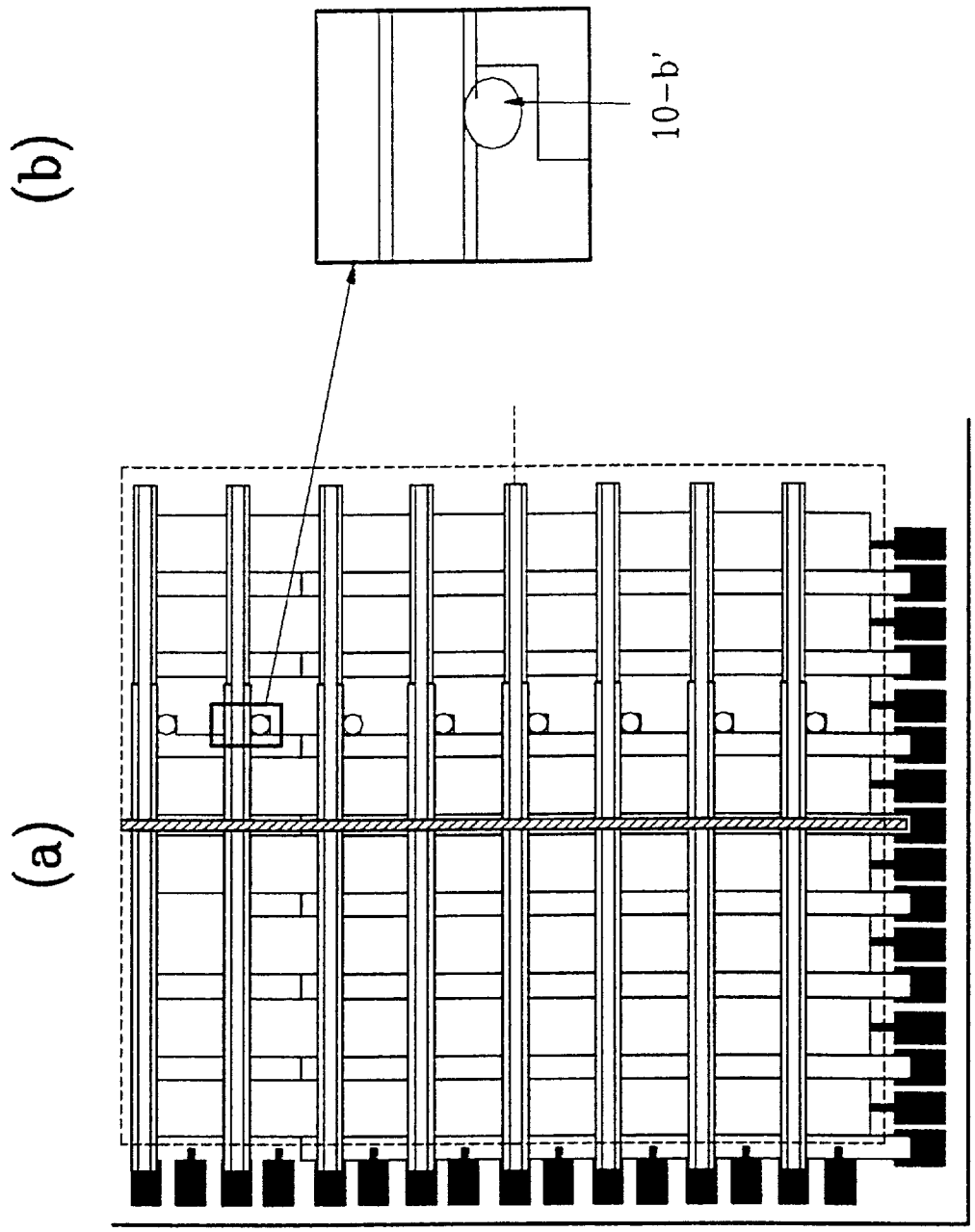
FIG. 13(a) illustrates the process of exposing a part of second bus electrode 10-b' by etching out organic function layers on top of said bus electrode 10-b'.
FIG. 13(b) is a closeup.
Figure 14:
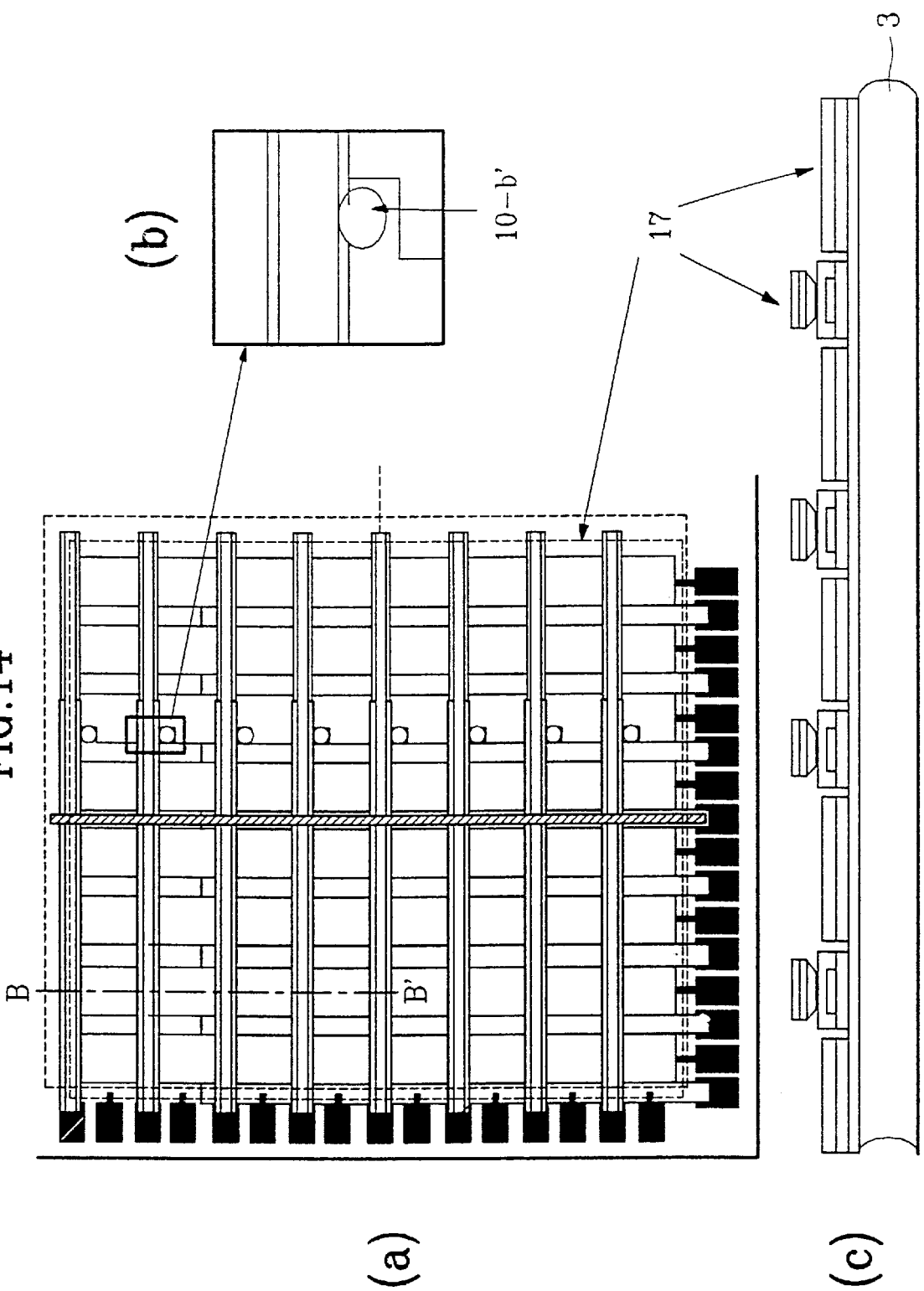
FIG. 14(a) illustrates the process of forming second electrodes.
FIG. 14(b) is an enlarged view.
FIG. 14(c) shows a cross-sectional view taken along the line B–B' in FIG. 14(a)

FIG. 13 illustrates the process of exposing a part of second bus electrode 10-*b*' by etching out organic function layers deposited right on top of said bus electrode 10-*b*' for the purpose of making an electrical contact between said bus electrode and the second electrode layer which is to be deposited in the following step (FIG. 14). The etching can be accomplished preferably using a dry etching process such as reactive ion etching or laser etching. Figures show, for convenience, only one window for electrical contact per each of second bus electrodes, but the number of said contact windows or connection pads may be increased to, for example, one per each pixel, if necessary, in alternative embodiments. For most applications, one contact window per each bus electrode is sufficient because the material for a second electrode (Al, Mg:Ag or Al:Li) generally has much lower resistivity compared to that for a first electrode (ITO). After the formation of second electrodes, the formation of protective layer(s) and an encapsulation process are followed to complete the panel fabrication.

Figure 15:
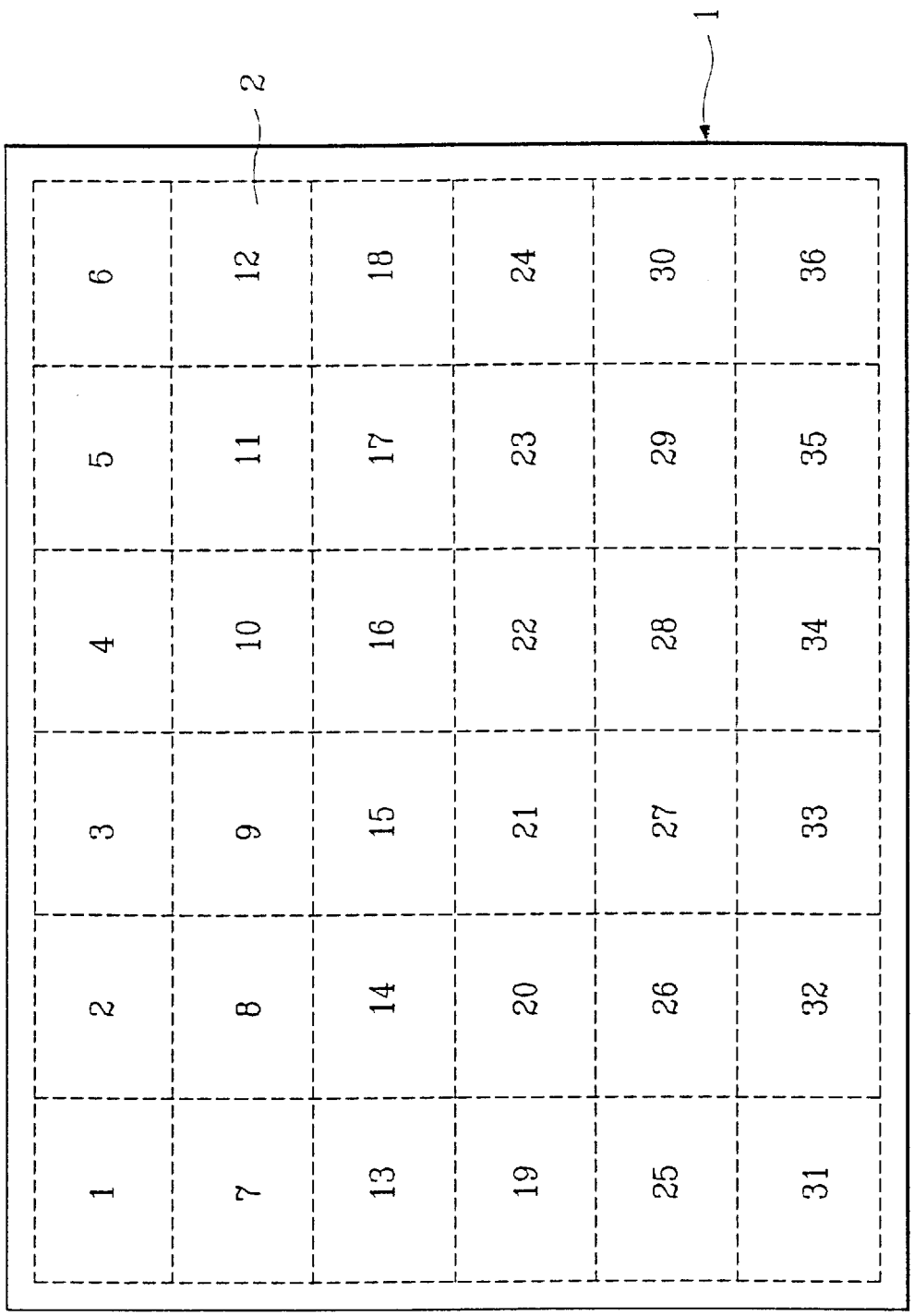
FIG. 15 shows a plan view of a display panel having (6×6) sub-panels.
Figure 16:
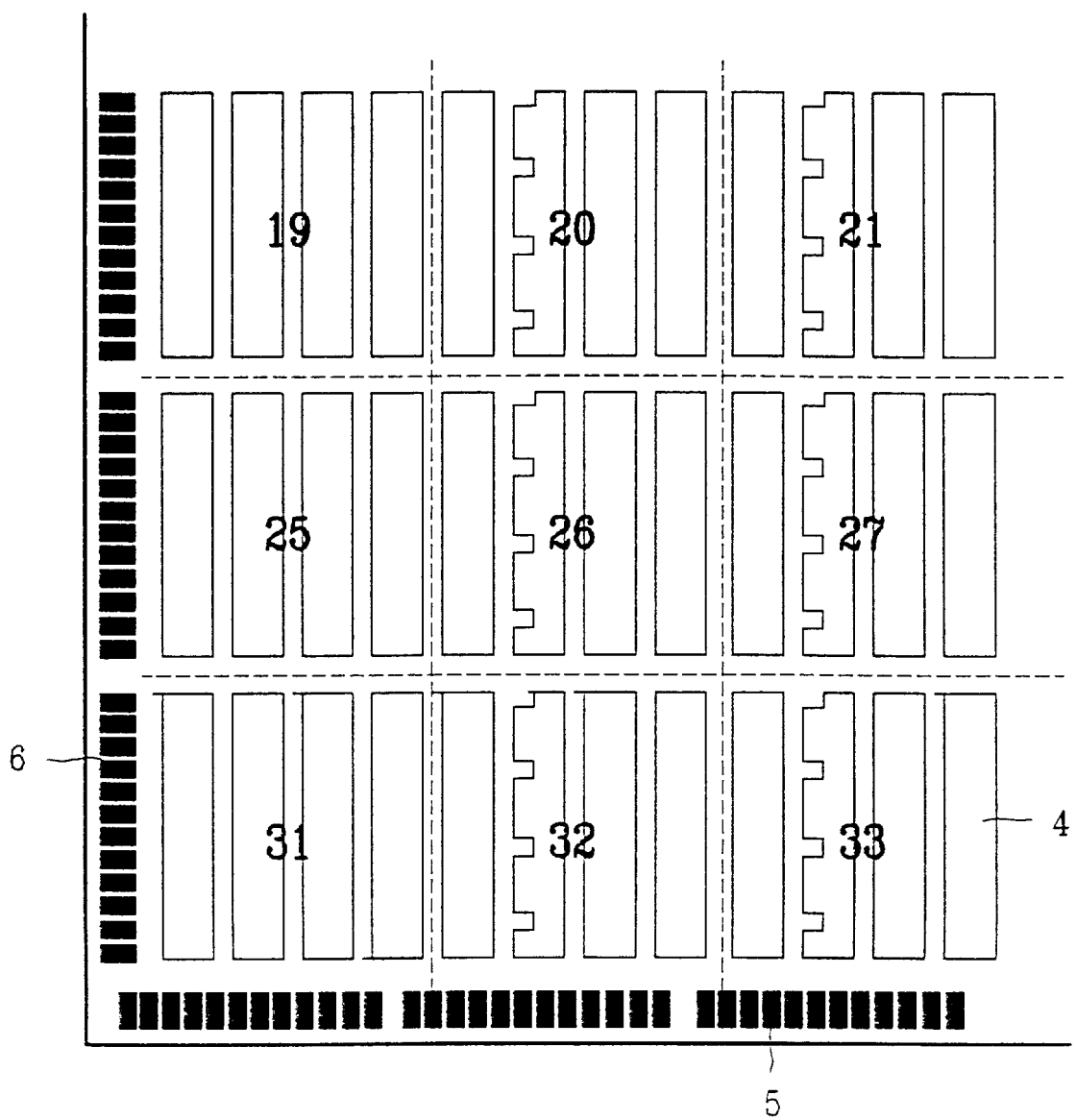
FIG. 16 is a close-up view illustrating the process of forming a plurality of first electrodes and a plurality of contact pads for first and second electrodes.
Figure 18A:
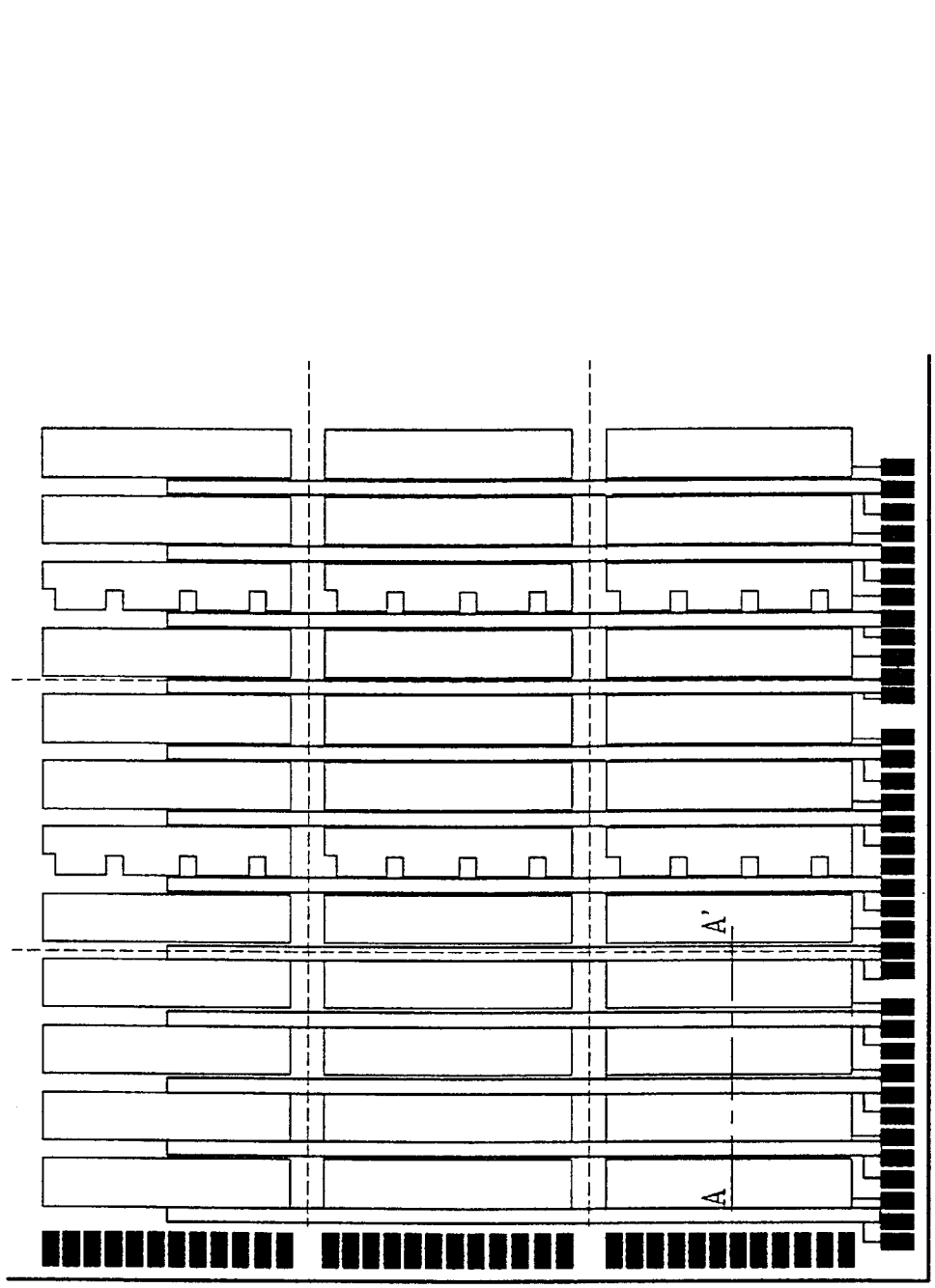
FIG. 18(a) is a plan view showing the process of covering first bus electrodes with an insulating layer.
Figure 18B:
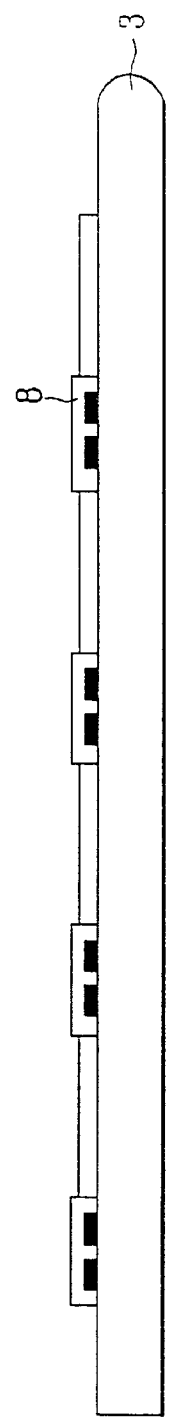
FIG. 18(b) illustrates a cross-sectional view taken along the line A–A' in FIG. 18(a)
Figures 20A, 20B, 20C:
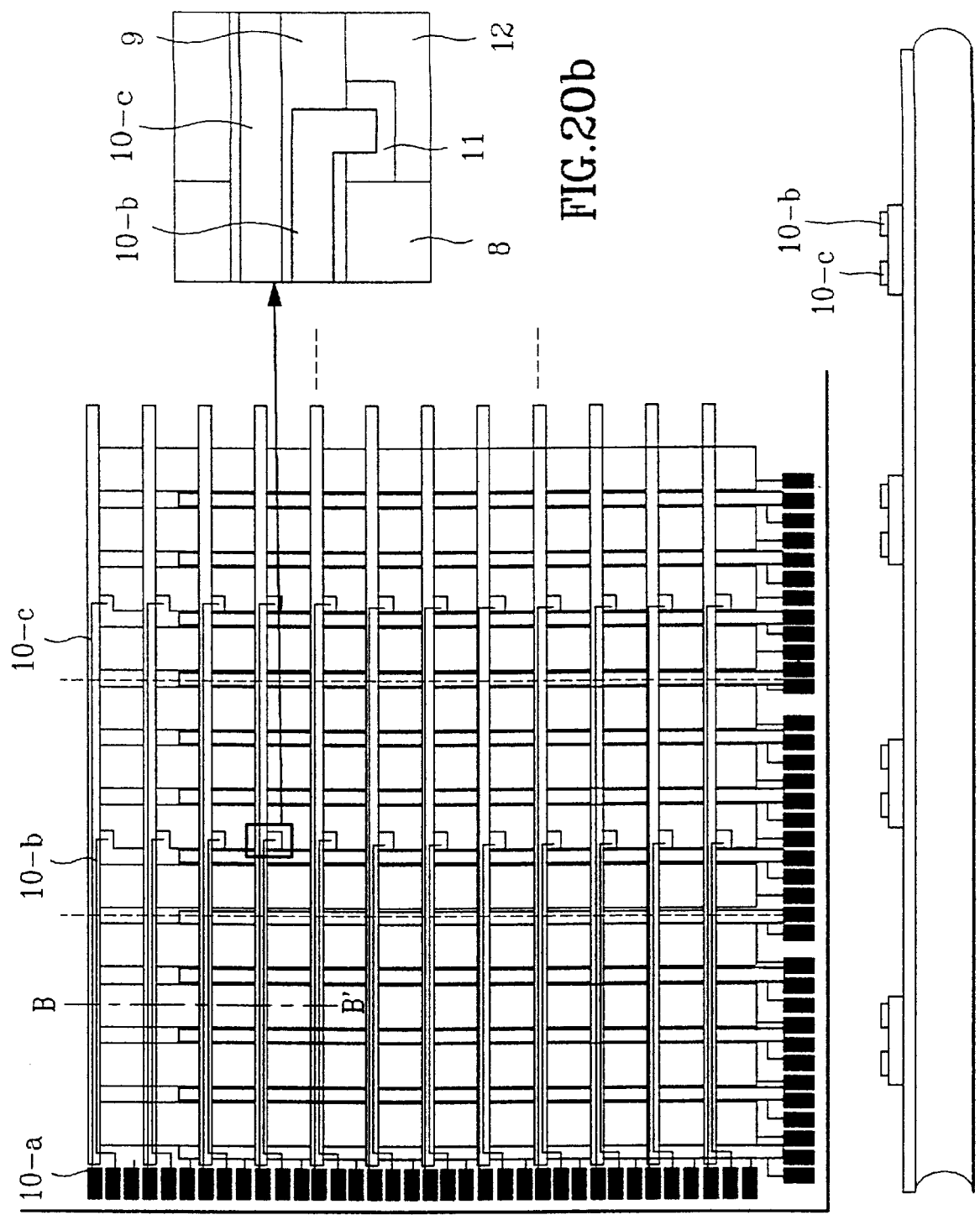
FIG. 20(a) is a schematic view illustrating the process of forming second bus electrodes.
FIG. 20(b) is a blow-up.
FIG. 20(c) illustrates a cross-sectional view taken along the line B–B' in FIG. 20(a)
Figure 24:
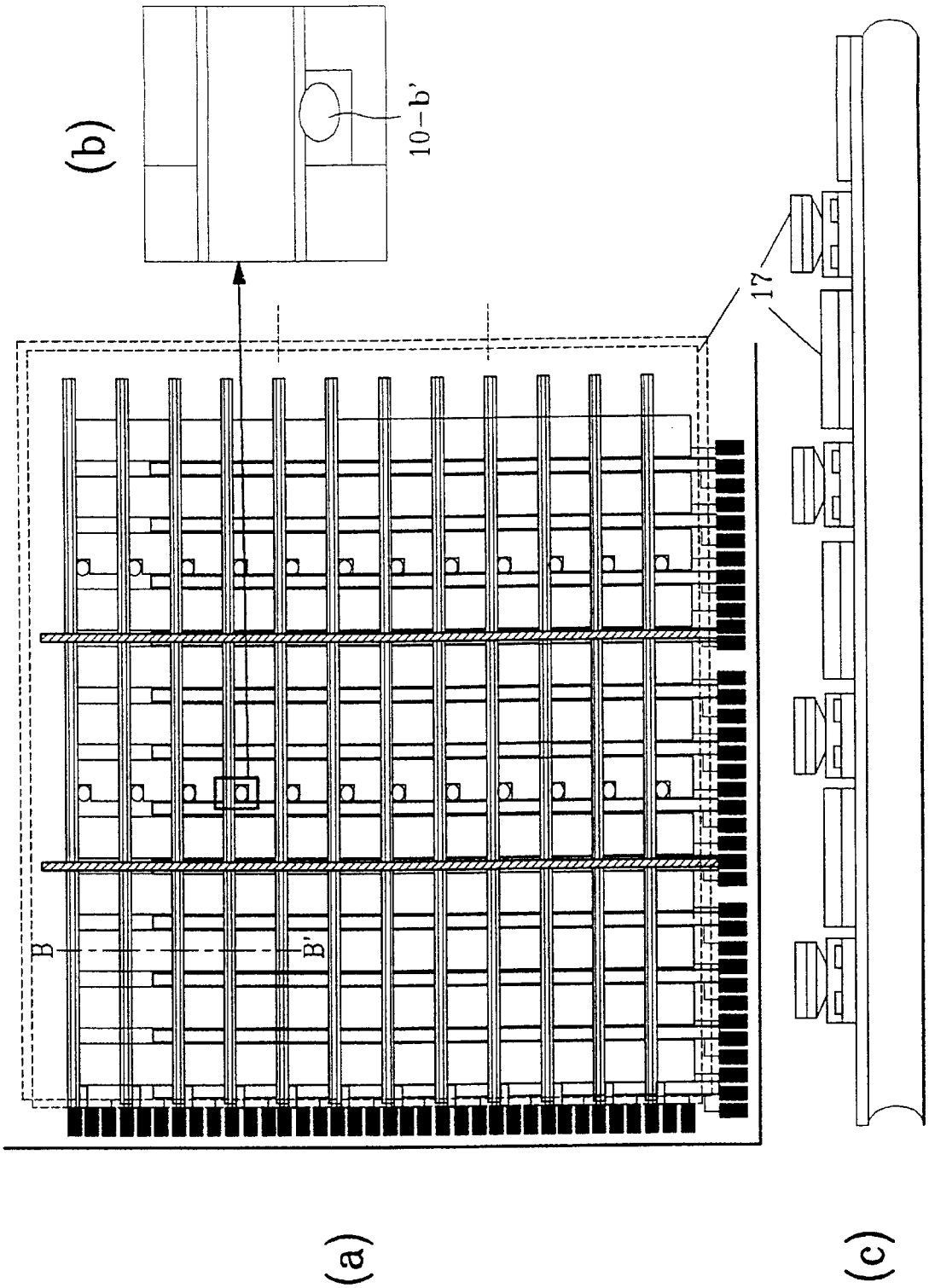
FIG. 24 illustrates the process of forming second electrodes.

The exemplary fabrication processes described for (4×4) sub-panels are applicable to the fabrication of an even larger panel such as (6×6) sub-panels, as shown in FIG. 15. Due to the symmetry involved, description with respect to only (3×3) sub-panels (FIG. 16) should be sufficient to elucidate the fabrication steps of (6×6) sub-panels. The illustrations of FIGS. 17–24 concern the processing steps for said panel with (3×3) sub-panels, which are basically the same as those for the (4×4) sub-panels described already and the explanation of FIGS. 17–24 is readily apparent based on the description of FIGS. 2–14. However, there are some differences. As shown in FIG. 17, it is necessary to form one more bus electrodes per each first electrode compared to the (4×4) sub-panels. The two lanes of bus electrodes are shown to be laid down side by side as shown in FIG. 25, but it is also possible to form a multilayer structure by stacking a lane per each layer, as shown in FIG. 25(*b*). FIG. 20 shows again the presence of one more bus electrodes per each second electrode compared to the (4×4) sub-panels, i.e. 10-*a*, 10-*b* and 10-*c*.

Figures 26A, 26B:
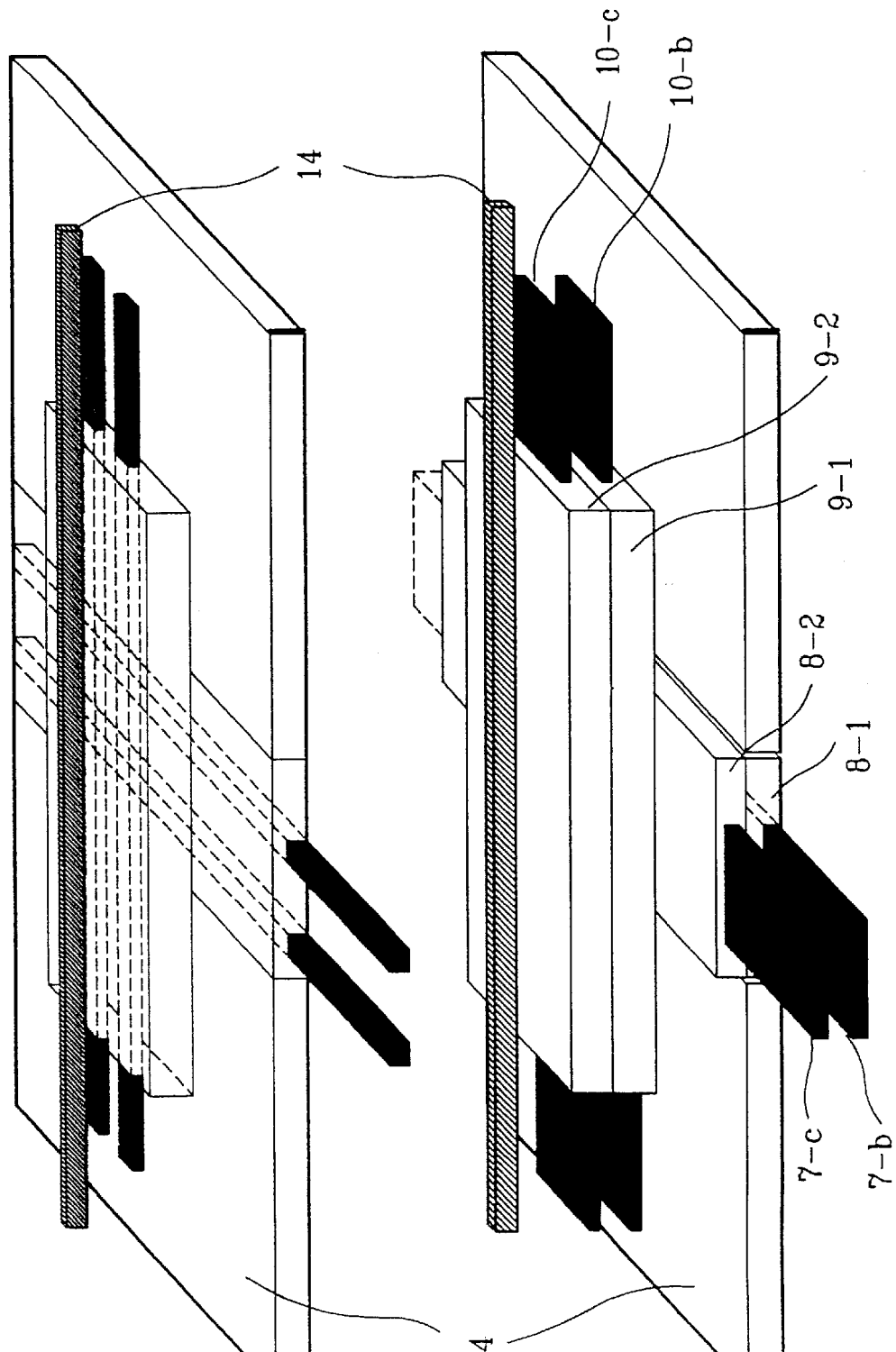
FIG. 26 is a perspective view describing the intersections of first and second bus electrodes: (a) two lanes of bus electrode per layer and (b) a single lane per layer.

In general, the fabrication scheme described above can be extended to the fabrication of a display panel with m×n sub-panels including 1×n or m×1 sub-panels. If so, as shown in FIG. 25, bus electrodes need to be formed in a multilayer structure. These multilayer bus electrodes may be formed either thin or thick film processing technologies. For reference, FIG. 26 is a perspective view describing the intersections of first and second bus electrodes.

Each of the sub-panels fabricated as described above can be driven using a driving circuitry which is separate, but not completely independent from the remaining circuitry which obviates the problems of the passive addressing of the background art. Separate driving here means that each sub-panel has separate scan and data lines which should be properly synchronized with the remaining circuitry.

The organic EL devices of the preferred embodiments of the present invention have various advantages. Effective driving of a large organic EL display panel has been made possible by forming a plurality of stripes for each of the first electrodes and also for each of the second electrodes. These stripes are electrically isolated from each other, which enables each group of pixels defined by a set of orthogonal stripes to be driven separately from the remaining groups of pixels. Efficient fabrication methods devised to construct the display panel are cost effective and are suitable for mass production.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An organic electroluminescent (EL) display panel comprising:
   a plurality of emitting portions laminated between a plurality of first and second electrodes, wherein each of said plurality of first and second electrodes comprises a plurality of conductive layers arranged in a matrix of at least one row and at least one column and said conductive layers being electrically isolated from each other, wherein said matrix of at least one row and at least one column is divided into n×m sub-panels, where n and m are integers equal to at least one;
   a substrate, wherein said plurality of first electrodes are formed on said substrate and each of said plurality of first electrodes are electrically connected to a first bus electrode; and
   organic function layers formed on said first electrodes, wherein each of said organic function layers comprises at least one organic EL medium layer, wherein said plurality of second electrodes are formed on said organic function layers and each of said plurality of second electrodes are electrically connected to a second bus electrode, wherein each of said first bus electrodes or second bus electrodes comprises a portion of a multilayer vertically stacked structure with an electrically insulating layer in between, wherein
   each of said multilayer vertically stacked structures comprises one of said plurality of first and second bus electrodes arranged side by side with an electrically insulating gap in between.

2. The organic EL display panel of claim 1, wherein each row or column of said first electrodes and a corresponding first bus electrode are formed to remain in electrical contact in at least one location.

3. The organic EL display panel of claim 1, wherein said first and second bus electrodes are made of at least one conductive material and said substrate is made of a transparent material.

4. The organic EL display panel of claim 3, wherein said electrically conductive material consists of at least one of metals, alloys and conducting polymers.

5. The organic EL display panel of claim 4, wherein said metal is one of aluminum, copper, nickel, chromium, silver and gold.

6. An organic electroluminescent (EL) display panel comprising:
   a plurality of sub-panels divided into a plurality of emitting portions formed on a substrate on which a plurality of first electrodes and second electrodes corresponding to the sub-panels are formed, wherein each of said plurality of first or second electrodes comprises a plurality of first conductive layers or second conductive layers, respectively, arranged in an array of at least one row and at least one column, each of said first conductive layers or second conductive layers being isolated from each other;
   a plurality of first bus electrodes coupled to corresponding first electrodes, wherein said plurality of first bus electrodes is formed in a column direction between at least one of adjacent first conductive layers for coupling at a first side of a corresponding first conductive layer and corresponding first conductive layers for coupling at a second side and wherein the first and second sides are different sides of the first conductive layers, wherein each of said plurality of first bus electrodes comprises at least one conductive first connection formed on the substrate and a first insulating layer covering said conductive first connection;
   a plurality of second bus electrodes insulatively projecting from the substrate for exposing at least portions of the first electrodes respectively, wherein said plurality of second bus electrodes are formed in a row direction between at least one of adjacent second conductive layers for coupling at a first side of a corresponding second conductive layer and corresponding second conductive layer for coupling at a second side, wherein the first and second sides are different sides of the second conductive layers and wherein each of said plurality of second bus electrodes comprises a second insulation layer formed on the first conductive layer, at least one conductive second connection formed on the first conductive layer and a third insulation layer formed on the conductive second connection;
   at least one of first organic function layers, second organic function layers and third organic function layers formed on the exposed portions of the first electrodes, each of said first organic function layers, second organic function layers and third organic function layers including at least one organic electroluminescent medium; and
   said plurality of second electrodes formed on said at least one of first, second and third organic function layers and coupled to corresponding second bus electrodes.

7. The organic EL display panel of claim 6, wherein said plurality of sub-panels are arranged in n×m array of sub-panels, where n and m are integers equal to at least 1.

8. The organic EL display panel of claim 6, further comprising a rampart formed on a corresponding first bus electrode located between adjacent sub-panels.

9. The organic EL display panel of claim 6, wherein said plurality of first conductive layers is made of a light transmissive material.

10. The organic EL display panel of claim 9, wherein the light transmissive material is indium tin oxide.

11. The organic EL display panel of claim 6, wherein said substrate is light transmissive.

12. The organic EL display panel of claim 6, wherein said first conductive layers have a substantially rectangular shape.

13. The organic EL display panel of claim 12, wherein a corresponding first conductive layer in a corresponding sub-panel includes a plurality of notches on one side of the substantially rectangular shape.

14. The organic EL display panel of claim 6, wherein said plurality of second conductive layers is made of one of a low resistance metal and alloy.

15. The organic EL display panel of claim 14, wherein the low resistance metal is aluminum, and the alloy is one of Mg:Ag and Al:Li.

16. The organic EL display panel of claim 6, wherein each of said conductive first and second connections are made of at least one conductive material.

17. The organic EL display panel of claim 16, wherein the conductive material is at least one a metal, an alloy and a conducting polymer.

18. The organic EL display panel of claim 17, wherein the metal is one of aluminum, copper, nickel, chromium, silver and gold.

19. The organic EL display panel of claim 6, wherein at least one of the conductive first connection is in contact with an entire first side of the corresponding first conductive layer and the conductive second connection is in contact with an entire first side of the corresponding second conductive layer.

20. The organic EL display panel of claim 6, wherein the first insulating layer isolates adjacent conductive first connections when there is more than one conductive first connection for each first bus electrode and said third insulating layer isolates adjacent conductive second connections when there is more than one conductive second connection for each second bus electrode.

21. The organic EL display panel of claim 20, wherein at least one of the adjacent conductive first and second connections are vertically stacked.

22. The organic EL display panel of claim 6, wherein a corresponding end of at least one second conductive connection is coupled to a corresponding second electrode via an opening formed in corresponding first, second and third organic function layers.

23. The organic EL display panel of claim 22, wherein the corresponding end has a bus electrode formed substantially perpendicular to the second conductive connection.

24. The organic EL display panel of claim 23, wherein said first conductive layers have a substantially rectangular shape, and a corresponding first conductive layer in a corresponding subpanels includes a plurality of notches on one side of the substantially rectangular shape.

25. The organic EL display panel of claim 24, wherein the bus electrode protrudes into an area defined by a corresponding notch.

26. A method of making an organic electroluminescent display panel comprising:

forming a plurality of first electrodes in an array of rows and columns on a substrate, each first electrode being electrically isolated from each other;

forming a plurality of first bus electrodes between adjacent first electrodes in a column direction and coupled to corresponding first electrodes, wherein each of said plurality of first bus electrodes comprises at least one conductive first connection formed on the substrate and a first insulating layer covering said conductive first connection;

forming a plurality of second bus electrodes in a row direction and insulatively projecting from the substrate for exposing at least portions of the first electrodes respectively, wherein each of said plurality of second bus electrodes comprises a second insulation layer formed on the first conductive layer, at least one conductive second connection formed on the first conductive layer and a third insulation layer formed on the conductive second connection;

forming at least one of first, second and third function layers on the exposed portions of the first electrodes, each of said first, second and third organic function layers including at least one organic electroluminescent medium; and forming a plurality of second electrodes on said at least one of first, second and third organic function layers and coupled to corresponding second bus electrodes.

27. The organic EL display panel of claim 26, wherein the plurality of first bus electrodes or second bus electrodes comprise a portion of multilayer vertically stacked structure with an electrically insulating layer in between.

28. The organic EL display panel of claim 27, wherein each of the multilayer vertically stacked structures comprises one of said plurality of first and second bus electrodes arranged side by side with an electrically insulating gap in between.

29. The organic EL display panel of claim 26, wherein each of said conductive first and second connections comprise a metal, an alloy or a conducting polymer.

30. The organic EL display panel of claim 26, wherein at least one of said conductive first or second connections comprise aluminum, copper, nickel, chromium, silver or gold.

31. The organic EL display panel of claim 26, wherein at least one of the conductive first connection is in contact with an entire first side of the corresponding first conductive layer and the conductive second connection is in contact with an entire first side of the corresponding second conductive layer.

32. The organic EL display panel of claim 26, wherein the first insulating layer isolates adjacent conductive first connections when there is more than one conductive first connection for each first bus electrode and said third insulating layer isolates adjacent conductive second connections when there is more than one conductive second connection for each second bus electrode.

* * * * *